(12) United States Patent
Shin et al.

(10) Patent No.: US 11,977,300 B2
(45) Date of Patent: May 7, 2024

(54) DISPLAY PANEL AND DISPLAY DEVICE

(71) Applicant: Samsung Display Co., LTD., Yongin-si (KR)

(72) Inventors: Dong Hee Shin, Asan-si (KR); Yonghee Lee, Suwon-si (KR); Geunho Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 61 days.

(21) Appl. No.: 17/117,787

(22) Filed: Dec. 10, 2020

(65) Prior Publication Data
US 2021/0325714 A1   Oct. 21, 2021

(30) Foreign Application Priority Data

Apr. 21, 2020   (KR) .................. 10-2020-0047886

(51) Int. Cl.
| | | |
|---|---|---|
| *G02F 1/1339* | (2006.01) | |
| *G02F 1/1333* | (2006.01) | |
| *G02F 1/1335* | (2006.01) | |
| *G02F 1/1345* | (2006.01) | |
| *G02F 1/1362* | (2006.01) | |
| *G02F 1/1368* | (2006.01) | |

(52) U.S. Cl.
CPC .... *G02F 1/13394* (2013.01); *G02F 1/133514* (2013.01); *G02F 1/13452* (2013.01); *G02F 1/13458* (2013.01); *G02F 1/136222* (2021.01); G02F 1/133351 (2013.01); G02F 1/136254 (2021.01); G02F 1/136286 (2013.01); G02F 1/1368 (2013.01)

(58) Field of Classification Search
CPC ............... G02F 1/13452; G02F 1/1345; G02F 1/13456; G02F 1/133514; G02F 1/133519; G02F 1/13396; G02F 1/13394; G02F 1/13398; G02F 1/13458
USPC .......................... 349/106, 149–153, 155–156
See application file for complete search history.

(56) References Cited

U.S. PATENT DOCUMENTS

| | | | | |
|---|---|---|---|---|
| 5,880,803 | A * | 3/1999 | Tamai ................. | G02F 1/13394 349/110 |
| 5,917,572 | A * | 6/1999 | Kurauchi ............ | G02F 1/13394 349/39 |
| 6,010,384 | A | 1/2000 | Nishino et al. | |
| 6,480,255 | B2 * | 11/2002 | Hoshino ............... | G02F 1/1345 349/149 |

(Continued)

FOREIGN PATENT DOCUMENTS

| | | |
|---|---|---|
| JP | 2965976 | 10/1999 |
| JP | 3889487 | 3/2007 |

(Continued)

*Primary Examiner* — Edward J Glick
*Assistant Examiner* — David Y Chung
(74) *Attorney, Agent, or Firm* — KILE PARK REED & HOUTTEMAN PLLC

(57) ABSTRACT

A display device includes a first base substrate, a second base substrate disposed on the first base substrate, a connecting member disposed between the first base substrate and the second base substrate, a pad disposed on the first base substrate, and a first protruding pattern disposed between the connecting member and the pad. A thickness of the first protruding pattern is smaller than a thickness of the connecting member.

20 Claims, 25 Drawing Sheets

(56) References Cited

U.S. PATENT DOCUMENTS

| | | | |
|---|---|---|---|
| 6,683,671 B1* | 1/2004 | Morimoto | G02F 1/13394 349/155 |
| 7,009,676 B1* | 3/2006 | Kim | G02F 1/13458 349/149 |
| 8,724,057 B2* | 5/2014 | Tseng | G02F 1/136209 349/110 |
| 2007/0229752 A1* | 10/2007 | Chen | G02F 1/13454 349/152 |
| 2010/0149465 A1* | 6/2010 | Lin | G02F 1/133514 349/122 |
| 2011/0090443 A1* | 4/2011 | Han | G02F 1/133788 349/123 |
| 2013/0242242 A1* | 9/2013 | Saida | G02F 1/1345 445/25 |
| 2015/0144915 A1* | 5/2015 | Lee | G09G 3/006 257/40 |
| 2021/0208457 A1* | 7/2021 | Son | G02F 1/1345 |

FOREIGN PATENT DOCUMENTS

| | | |
|---|---|---|
| JP | 2010-54536 | 3/2010 |
| KR | 10-1258085 | 4/2013 |

* cited by examiner

DISPLAY PANEL AND DISPLAY DEVICE

CROSS-REFERENCE TO RELATED APPLICATION(S)

This application claims priority to and benefits of Korean Patent Application No. 10-2020-0047886 under 35 U.S.C. § 119, filed on Apr. 21, 2020, the entire contents of which are incorporated herein by reference.

BACKGROUND

1. Technical Field

The disclosure herein relates to a display panel and a display device having improved image quality and manufacturing yield.

2. Description of the Related Art

In general, a display device may include a display panel and a circuit board. The display panel may be cut several times during the manufacturing process and then connected to the circuit board. For example, the circuit board may be electrically connected to the pad of the display panel by an anisotropic conductive film. Alternatively, an anisotropic conductive film may not be used, and the electrodes of the circuit board and the pads of the display panel may be electrically connected by an ultrasonic bonding method.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel and a display device with improved manufacturing yield.

The disclosure also provides a display panel and a display device with improved image quality.

An embodiment provides a display device that may include a first base substrate; a second base substrate disposed on the first base substrate; a connecting member disposed between the first base substrate and the second base substrate; a pad disposed on the first base substrate; and a first protruding pattern disposed between the connecting member and the pad, wherein a thickness of the first protruding pattern may be smaller than a thickness of the connecting member.

In an embodiment, the second base substrate may have a smaller area than an area of the first base substrate, and a side of the second base substrate may overlap the first base substrate in a thickness direction of the first base substrate.

In an embodiment, the first protruding pattern may be disposed on the first base substrate, and the first protruding pattern and the side of the second base substrate may extend in a same direction.

In an embodiment, the first protruding pattern may be spaced apart from the second base substrate in the thickness direction of the first base substrate.

In an embodiment, the first protruding pattern may overlap the side of the second base substrate in the thickness direction of the first base substrate.

In an embodiment, the first protruding pattern may include a first protruding portion and a second protruding portion, the first protruding portion may not overlap the second base substrate in the thickness direction of the first base substrate, and the second protruding portion may overlap the second base substrate.

In an embodiment, the display device may further include a second protruding pattern spaced apart from the first protruding pattern, wherein the pad may be disposed between the first protruding pattern and the second protruding pattern.

In an embodiment, a stacking structure of the first protruding pattern and a stacking structure of the second protruding pattern may be identical.

In an embodiment, a side surface of the second protruding pattern may be aligned with a side surface of the first base substrate.

In an embodiment, the display device may further include a test wiring disposed on the first base substrate and extending from the pad toward ab edge of the first base substrate, wherein the second protruding pattern may be disposed on the test wiring.

In an embodiment, the first protruding pattern may include a plurality of layers stacked in a thickness direction of the first base substrate.

In an embodiment, the first protruding pattern may include a first sub-layer of a first color; and a second sub-layer of a second color different from the first color, the second sub-layer being disposed on the first sub-layer.

In an embodiment, the first protruding pattern may further include a third sub-layer overlapping the first sub-layer and the second sub-layer.

In an embodiment, a display panel where an active area and a peripheral area adjacent to the active area are defined. The display panel includes a pixel disposed in the active area; a data wiring extending from the pixel toward the peripheral area; a pad electrically connected to the data wiring and disposed in the peripheral area; and a first protruding pattern disposed between the pad and the active area.

In an embodiment, the first protruding pattern may overlap a portion of the data wiring.

In an embodiment, the display panel may further include a second protruding pattern spaced apart from the first protruding pattern, wherein the pad may be disposed between the first protruding pattern and the second protruding pattern.

In an embodiment, the display panel may further include a test wiring extending from the pad in a direction away from the active area.

In an embodiment, a side surface of the test wiring may be aligned with a side surface of the display panel.

In an embodiment, a display device may include a display panel including an active area and a peripheral area adjacent to the active area; and a data driver overlapping an outer side surface of the display panel, wherein the display panel may include a pixel disposed in the active area; a pad electrically connected to the pixel and disposed in the peripheral area; a protruding pattern disposed between the pad and the active area; and a test wiring extending from the pad toward the outer side surface.

In an embodiment, a side surface of the test wiring may be aligned with the outer side surface of the display panel.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
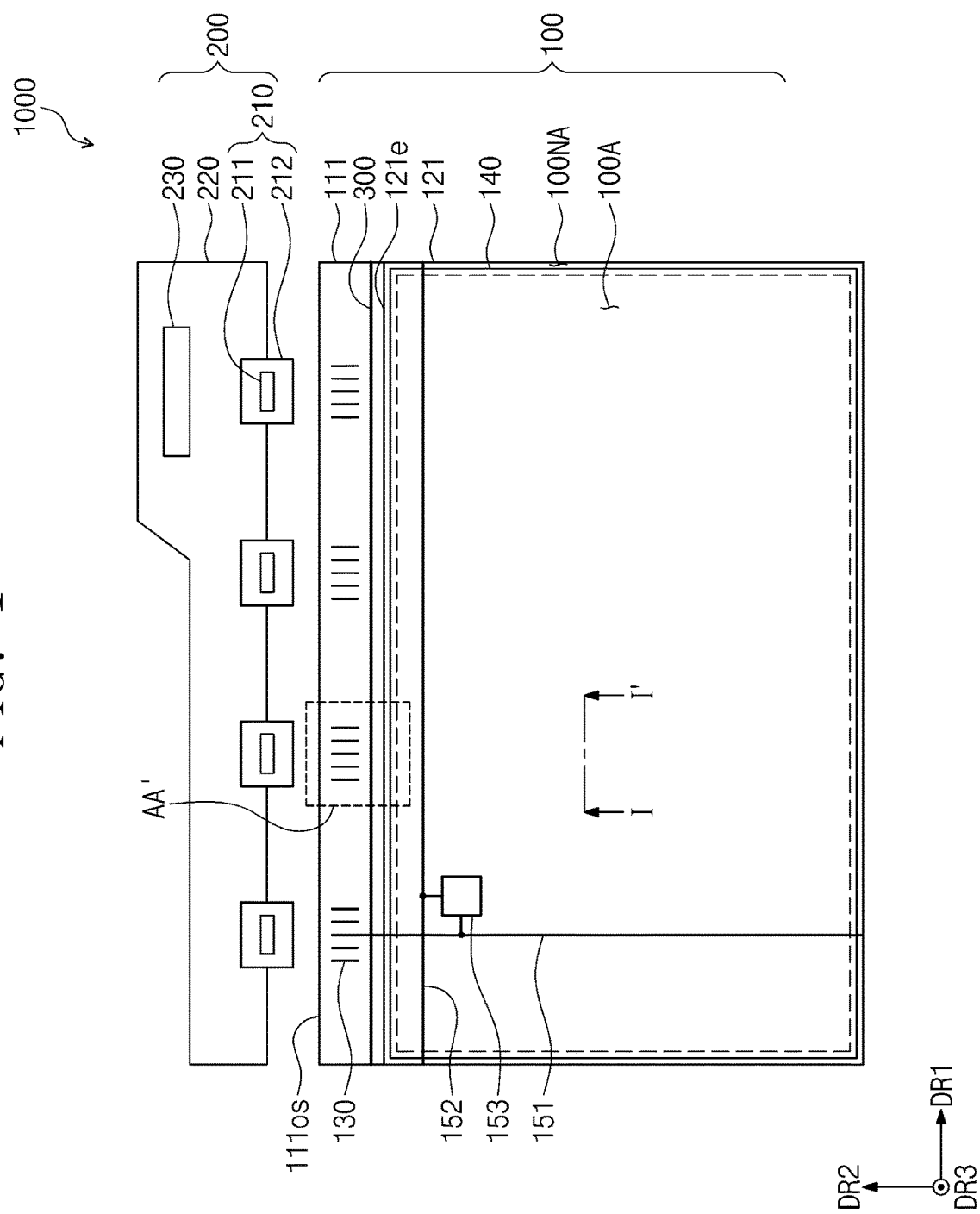
FIG. 1 is a plan view of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

In this specification, when it is mentioned that a component (or, an area, a layer, a part, etc.) is referred to as being "on", "connected to" or "combined to" or "coupled to" another component, this means that the component may be directly on, connected to, or combined or coupled to the other component or a third component therebetween may be present.

Like reference numerals refer to like elements. Additionally, in the drawings, the thicknesses, proportions, and dimensions of components are exaggerated for effective description.

It will be understood that the terms "first" and "second" are used herein to describe various components but these components should not be limited by these terms. The above terms are used only to distinguish one component from another. For example, a first component may be referred to as a second component and vice versa without departing from the spirit and scope of the disclosure. The terms of a singular form may include plural forms unless otherwise specified.

In addition, terms such as "below", "the lower side", "on", and "the upper side" are used to describe a relationship of configurations shown in the drawings. The terms are described as a relative concept based on a direction shown in the drawing.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments, the term "include," "comprise," "including," or "comprising," "having" or "has" specifies a property, a region, a fixed number, a step, a process, an element and/or a component but does not exclude other properties, regions, fixed numbers, steps, processes, elements and/or components.

Hereinafter, an embodiment will be described with reference to the drawings.

FIG. 1 is a plan view of a display device according to an embodiment.

Referring to FIG. 1, the display device 1000 may include a display panel 100 and a circuit part 200.

The display panel 100 may be a light-receiving display panel or a self-luminous display panel. In a case that the display panel 100 is a light-receiving display panel, the display device 1000 may include a backlight unit that provides light to the display panel 100. For example, the light-receiving display panel may be a liquid crystal display panel, and the self-luminous display panel may be an organic light emitting display panel, a quantum dot light emitting display panel, a micro LED display panel, or a nano LED display panel.

The active area 100A and the peripheral area 100NA may be defined in the display panel 100. The active area 100A is an area activated by an electrical signal, and the display device 1000 may display an image through the active area 100A.

The active area 100A may include a plane defined by the first direction DR1 and the second direction DR2. The thickness direction DR3 of the display panel 100 may be parallel to the third direction DR3 intersecting the first direction DR1 and the second direction DR2. Accordingly, the front surface (or upper surface) and back surface (or lower surface) of the members constituting the display panel 100 may be defined based on the third direction DR3.

The display panel 100 may include a first base substrate 111 and a second base substrate 121. Although not shown in the drawing, the display panel 100 may include an image implementation layer disposed between the first base substrate 111 and the second base substrate 121. For example, the image implementation layer may be a liquid crystal layer, an organic light emitting layer, a micro LED, a nano LED, or a quantum dot emitting layer depending on the type of the display panel 100.

The area of the first base substrate 111 may be larger than the area of the second base substrate 121. Therefore, in a case that the device may be viewed in a plan view, the side 121e of the second base substrate 121 may overlap the first base substrate 111. In the specification, what is viewed in a plan view may be understood to be viewed in the third direction DR3 or in the thickness direction of the display panel 100.

The display panel 100 may include a data wiring 151, a gate wiring 152 and a pixel 153 disposed between the first base substrate 111 and the second base substrate 121. Although only one data wiring 151, one gate wiring 152, and one pixel 153 are illustrated in FIG. 1, each of them may be provided in plural. The pads 130 may be disposed on the first base substrate 111. The pads 130 may be disposed on the upper surface of the first base substrate 111. For example, the pads 130 may be disposed in an area of the first base substrate 111 that does not overlap the second base substrate 121. In a case that the device may be viewed in a plan view, the pads 130 may be spaced apart from the second base substrate 121.

Each of the pads 130 may be electrically connected to one data wiring 151. Each of the pads 130 may transmit a data signal to the data wiring 151.

A protruding pattern 300 may be disposed in an area adjacent to the pads 130. The protruding pattern 300 may extend along the same direction as the arrangement direction of the pads 130. Alternatively, the protruding pattern 300 may extend in the same direction as the extending direction of the side 121e of the second base substrate 121. The pads 130 may be arranged or disposed along the first direction DR1. The side 121e of the second base substrate 121 may extend along the first direction DR1. Therefore, the protruding pattern 300 may extend along the first direction DR1.

The circuit part 200 may be electrically connected to the pads 130. In FIG. 1, the circuit part 200 is separated from the display panel 100. The circuit part 200 may include data drivers 210, a main circuit board 220, and a signal control circuit 230.

Each of the data drivers 210 may include a driving chip 211 and a circuit film 212. The circuit film 212 may have a structure in which an insulating layer and a conductive layer are stacked. The conductive layer may include signal wirings. The data drivers 210 may be electrically connected to signal wirings of the display panel 100, for example, data wirings 151. For example, the data drivers 210 may be electrically connected to the pads 130 through an anisotropic conductive film or solder ball.

The data drivers 210 may overlap some or a predetermined number of the side surfaces of the display panel 100. The side surface of the display panel 100 overlapping the data drivers 210 may be referred to as an outer side surface 111os.

Although not shown in the drawing, the gate driving circuit may be integrated or disposed in the peripheral area 100NA of the display panel 100. However, the disclosure is not limited thereto, and the gate driving circuit may be provided as gate drivers including a driving chip and a circuit film, such as data drivers 210. In this case, the gate drivers may be electrically connected to the display panel 100 through an anisotropic conductive film or solder ball. The gate driving circuit may be electrically connected to signal wirings of the display panel 100, for example, gate wirings 152.

The main circuit board 220 may be electrically connected to the circuit film 212 of each of the data drivers 210. For example, the main circuit board 220 may be electrically connected to the circuit film 212 through an anisotropic conductive film or solder ball.

The signal control circuit 230 may be mounted on the main circuit board 220. The signal control circuit 230 receives image data and control signals from an external graphic control unit (not shown). The signal control circuit 230 may provide a control signal to the data drivers 210. In an embodiment, the driving chip 211 of the data drivers 210 may be mounted on the main circuit board 220.

Figure 2:
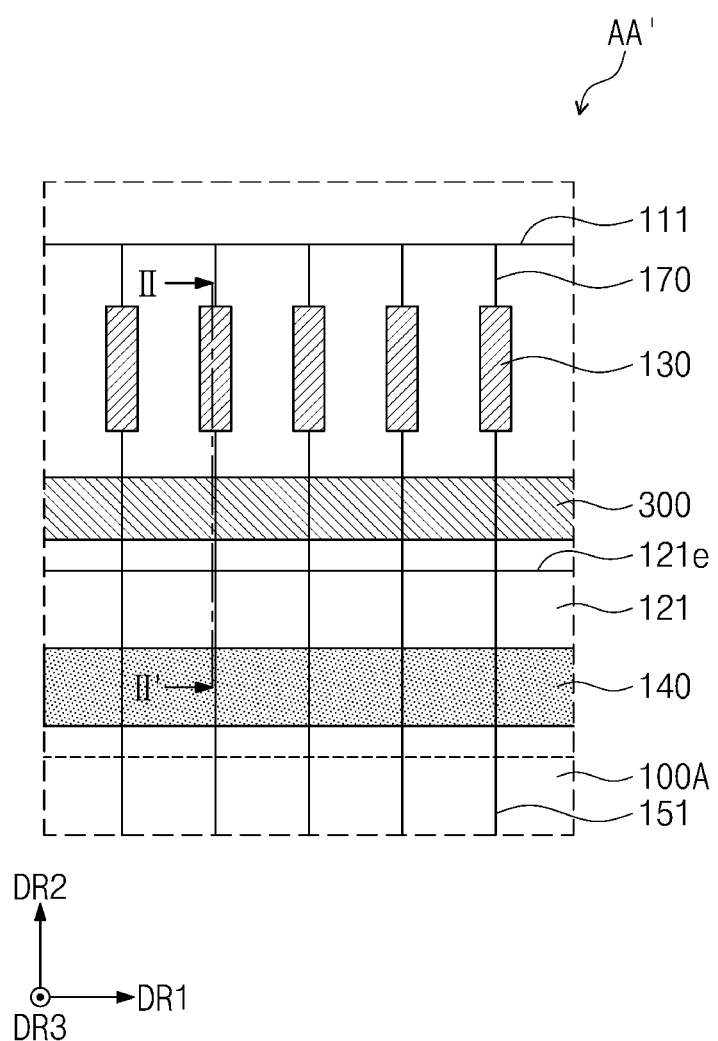
FIG. 2 is a plan view showing an enlarged AA' of FIG. 1 according to an embodiment.

FIG. 2 is a plan view showing an enlarged AA' of FIG. 1 according to an embodiment.

Referring to FIGS. 1 and 2, a first base substrate 111, a second base substrate 121, pads 130, a coupling member 140, and a protruding pattern 300 are illustrated.

The coupling member 140 may be disposed between the first base substrate 111 and the second base substrate 121. Therefore, in a case that the device may be viewed in the third direction DR3, the coupling member 140 may overlap both the first base substrate 111 and the second base substrate 121. The coupling member 140 may have a closed line shape surrounding the active area 100A.

The coupling member 140 may be any type of connector that couples the first base substrate 111 and the second base substrate 121 together. The coupling member 140 may include an organic material such as a photocurable resin or a photopolymerizable resin, or may include an inorganic material such as a frit seal, and is not limited to any one embodiment. The coupling member may also be referred to as a sealant, connector, or connection member.

In a case that the device may be viewed in a plan view, the protruding pattern 300 may be disposed between the pads 130 and the coupling member 140. The protruding pattern 300 may not overlap the second base substrate 121. For example, the protruding pattern 300 may be disposed spaced apart from the side 121e of the second base substrate 121.

Each of the pads 130 may be electrically connected to each of the data wirings 151. The data wirings 151 may extend from the pads 130 toward the active area 100A. In a case that the device may be viewed in the third direction DR3, a portion of each of the data wirings 151 may overlap the protruding pattern 300.

Test wirings 170 extending from the pads 130 in a direction away from the active area 100A may be disposed on the first base substrate 111. The test wirings 170 extending from the pads 130 toward an edge of the first base substrate 111. The test wirings 170 may be respectively electrically connected to the pads 130. However, the inventive concept is not limited thereto, and the test wirings 170 may be electrically separated from the pads 130.

Figure 3:
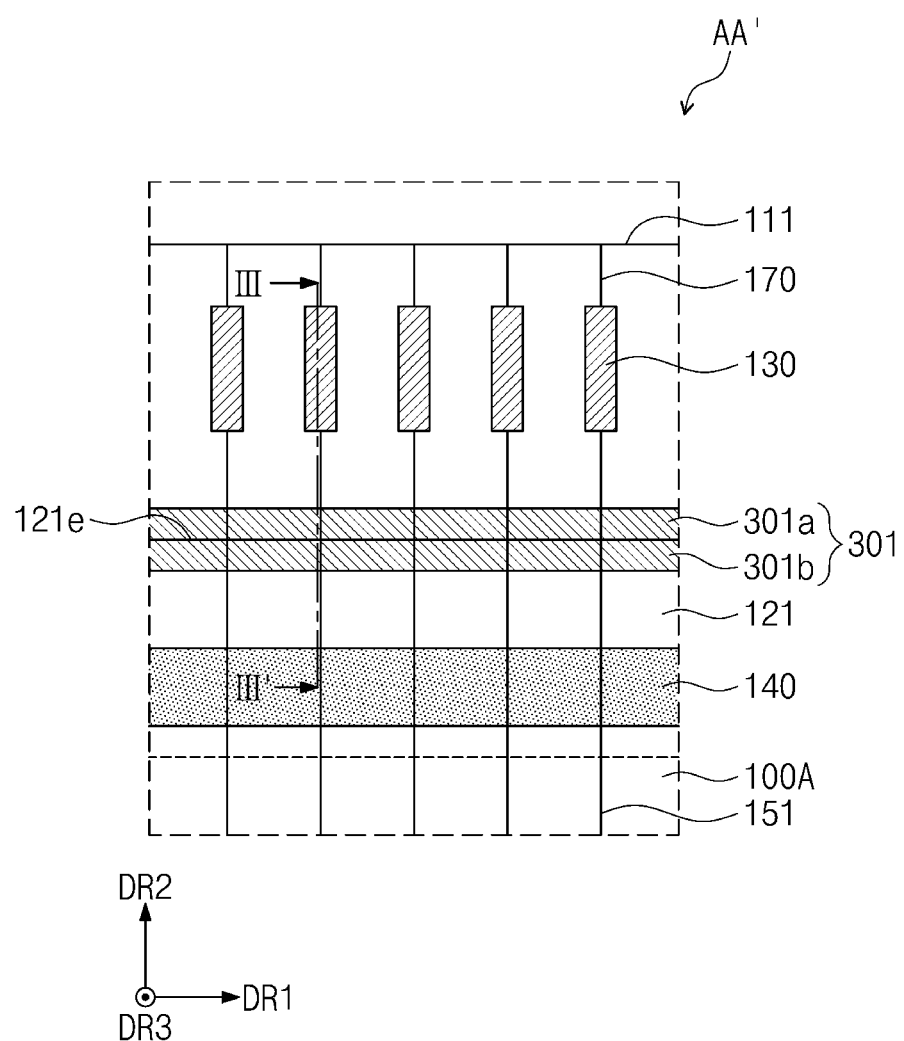
FIG. 3 is a plan view showing an enlarged AA' of FIG. 1 according to an embodiment.

FIG. 3 is a plan view showing an enlarged AA' of FIG. 1 according to an embodiment.

Referring to FIG. 3, a first base substrate 111, a second base substrate 121, pads 130, a coupling member 140, and a protruding pattern 301 are illustrated.

In a case that the device may be viewed in a plan view, the protruding pattern 301 may be disposed between the pads 130 and the coupling member 140. The protruding pattern 301 may include a first protruding portion 301a and a second protruding portion 301b. The first protruding portion 301a is a portion of the protruding pattern 301 that does not overlap the second base substrate 121, and the second protruding portion 301b is a portion of the protruding pattern 301 that overlaps the second base substrate 121. For example, in a case that the device may be viewed in a plan view, the protruding pattern 301 may overlap the side 121e of the second base substrate 121.

Figure 4A:
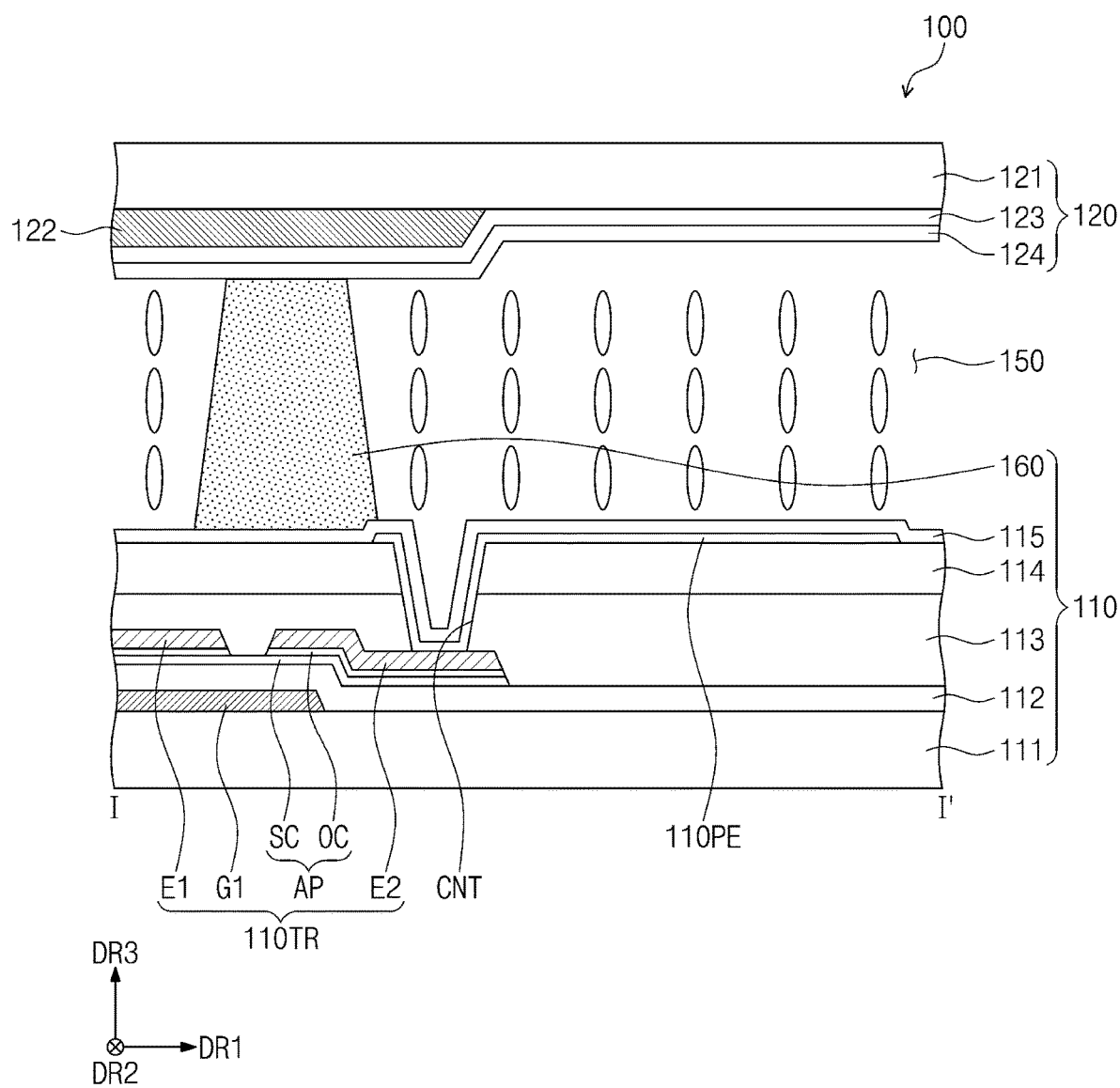
FIG. 4A is a schematic cross-sectional view cut along I-I' in FIG. 1 according to an embodiment.
Figure 4B:
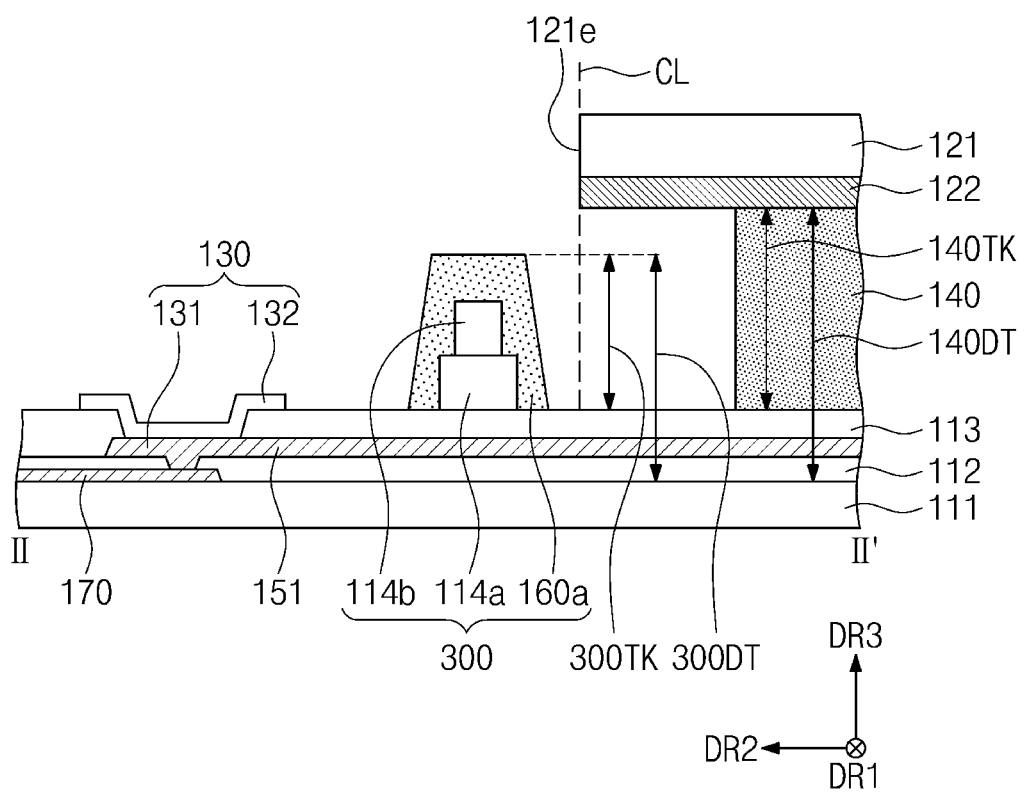
FIG. 4B is a schematic cross-sectional view cut along II-II' in FIG. 2 according to an embodiment

FIG. 4A is a schematic cross-sectional view cut along I-I' in FIG. 1 according to an embodiment. FIG. 4B is a schematic cross-sectional view cut along II-II' in FIG. 2 according to an embodiment.

Referring to FIGS. 4A and 4B, the display panel 100 may include a first substrate 110, a second substrate 120, and an image implementation layer 150. Hereinafter, the liquid crystal display panel will be described as an example of the display panel 100.

The first substrate 110 may include a first base substrate 111, a transistor 110TR, a first insulating layer 112, a second insulating layer 113, a color filter layer 114, a first electrode 110PE, a first alignment layer 115, a spacer 160, pads 130, and a protruding pattern 300.

The first base substrate 111 may be a glass substrate or a plastic substrate. The transistor 110TR may be disposed on the first base substrate 111. The transistor 110TR may include a control electrode G1, an activation pattern AP, an input electrode E1, and an output electrode E2.

The control electrode G1 may be disposed on the first base substrate 111. The first insulating layer 112 may be disposed on the first base substrate 111 and may cover or overlap the control electrode G1. The first insulating layer 112 may include at least one of an inorganic material and an organic material. For example, the first insulating layer 112 may include an inorganic material. The first insulating layer 112 may include at least one of a silicon nitride layer, a silicon oxy nitride layer, a silicon oxide layer, a titanium oxide layer, and an aluminum oxide layer.

The activation pattern AP may be disposed on the first insulating layer 112. For example, the activation pattern AP may be disposed at a position facing the control electrode G1 with the first insulating layer 112 therebetween. The activation pattern AP may include a semiconductor layer SC and an ohmic contact layer OC. The semiconductor layer SC may be disposed on the first insulating layer 112, and the ohmic contact layer OC may be disposed on the semiconductor layer SC. The semiconductor layer SC may include amorphous silicon or poly silicon. Additionally, the semiconductor layer SC may include a metal oxide semiconductor. The ohmic contract layer OC may include a dopant doped with higher density than the semiconductor layer.

The input electrode E1 and the output electrode E2 may be disposed on the activation pattern AP. The second insulating layer 113 may be disposed on the first insulating layer 112 and may cover or overlap the input electrode E1 and the output electrode E2. The second insulating layer 113 may have a single-layer structure or a multi-layer structure. The second insulating layer 113 may include at least one of an inorganic material and an organic material. For example, the second insulating layer 113 may include an acrylic-based organic material.

The color filter layer 114 may be disposed on the second insulating layer 113. The color filter layer 114 may include a red color filter, a blue color filter, and a green color filter.

Although not shown in the drawing, a cover layer covering or overlapping the color filter layer 114 may be disposed.

The first electrode 110PE may be disposed on the color filter layer 114. The first electrode 110PE may be referred to as a pixel electrode. The first electrode 110PE may be electrically connected to the output electrode E2 through a contact hole CNT passing through the second insulating layer 113 and the color filter layer 114.

The first alignment layer 115 may be disposed on the color filter layer 114 and may cover or overlap the first electrode 110PE. The spacer 160 may be disposed on the first alignment layer 115. The first base substrate 111 and the second base substrate 121 may maintain a predetermined distance by the spacer 160. The spacer 160 may have a substantially trapezoidal shape on a schematic cross section, but the shape of the spacer 160 is not limited thereto.

Each of the pads 130 may include a first pad pattern 131 and a second pad pattern 132. The first pad pattern 131 may be disposed between the first insulating layer 112 and the second insulating layer 113. The second pad pattern 132 may be disposed on the second insulating layer 113.

The first pad pattern 131 may include the same or similar material as the input electrode E1 and the output electrode E2, and may be simultaneously formed through the same process. The first pad pattern 131, the input electrode E1, and the output electrode E2 may have a single-layer structure or a multi-layer structure. The first pad pattern 131, the input electrode E1, and the output electrode E2 may include a metal such as aluminum (Al), silver (Ag), copper (Cu), molybdenum (Mo), chromium (Cr), tantalum (Ta), and titanium (Ti), or an alloy thereof. However, the inventive concept is not limited thereto.

The data wiring 151 is electrically connected to the first pad pattern 131 and may have an integral shape. For example, the first pad pattern 131 may be a portion extending from the data wiring 151.

The second pad pattern 132 may include the same or similar material as the first electrode 110PE, and may be simultaneously formed through the same process. The second pad pattern 132 and the first electrode 110PE may include transparent conductive oxide, and for example, the second pad pattern 132 and the first electrode 110PE may include at least one of indium tin oxide (ITO), indium zinc oxide (IZO), indium gallium oxide (IGO), indium zinc gallium oxide (IGZO), and mixtures/compounds thereof. However, the inventive concept is not limited thereto.

In addition, in an embodiment, the first pad pattern 131 may be disposed on the same layer as the control electrode G1. In this case, the first pad pattern 131 and the control electrode G1 may have a single-layer structure or a multi-layer structure. The first pad pattern 131 and the control electrode G1 may include a titanium layer and a copper layer, but are not limited thereto.

The second substrate 120 may include a second base substrate 121, a light blocking pattern 122, a second electrode 123, and a second alignment layer 124.

The second base substrate 121 may be a glass substrate or a plastic substrate. The light blocking pattern 122 may be disposed under or below the second base substrate 121. For example, the light blocking pattern 122 may be disposed on the lower surface of the second base substrate 121 facing the first base substrate 111.

The second electrode 123 may be disposed under or below the second base substrate 121 and may cover or overlap at least a portion of the light blocking pattern 122. A common voltage may be applied to the second electrode 123. The voltage applied to the second electrode 123 may be different from the voltage applied to the first electrode 110PE. Although not illustrated in the drawing, a planarization layer may be disposed between the second electrode 123 and the light blocking pattern 122. In this case, the planarization layer may be disposed under or below the second base substrate 121, cover or overlap the light blocking pattern 122, and provide a flat surface on a surface contacting the second electrode 123. The second alignment layer 124 may be disposed under or below the second electrode 123.

The image implementation layer 150 may be disposed between the first substrate 110 and the second substrate 120. The image implementation layer 150 may be a liquid crystal layer. In this case, the image implementation layer 150 may include liquid crystal molecules having dielectric anisotropy. The arrangement of the liquid crystal molecules may be changed according to the electric field formed between the first electrode 110PE and the second electrode 123. Light incident to the image implementation layer 150 may be transmitted or blocked depending on the arrangement direction of the liquid crystal molecules.

The coupling member 140 may be disposed between the first substrate 110 and the second substrate 120, and may be coupled or connected to the first substrate 110 and the second substrate 120.

In an embodiment, the protruding pattern 300 may be a component included in the first substrate 110. The protruding pattern 300 may be disposed on the second insulating layer 113. The protruding pattern 300 may include layers 114*a*, 114*b*, and 160*a* stacked in the thickness direction of the first base substrate 111, for example, in the third direction DR3.

The protruding pattern 300 may include a first layer 114*a*, a second layer 114*b*, and a third layer 160*a*. However, the number of layers constituting the protruding pattern 300 is not limited thereto. For example, the protruding pattern 300 may be composed of a single layer, or may be composed of four or more layers. The first layer 114*a*, the second layer 114*b*, and the third layer 160*a* may be referred to as a first sub-layer 114*a*, a second sub-layer 114*b*, and a third sub-layer 160*a*.

Each of the first layer 114*a* and the second layer 114*b* may be simultaneously formed during the process of forming the color filter layer 114. For example, the color filter layer 114 may include a red color filter, a blue color filter, and a green color filter, the first layer 114*a* may include the same or similar material as the green color filter, and may be formed simultaneously with the green color filter, and the second layer 114*b* may include the same or similar material as the blue color filter, and may be formed simultaneously with the blue color filter.

The third layer 160*a* may cover or overlap the first layer 114*a* and the second layer 114*b*. The third layer 160*a* may cover or overlap all of the upper surface of the second layer 114*b*, the side surfaces of the second layer 114*b*, and the side surfaces of the first layer 114*a*. The third layer 160*a* may include the same or similar material as the spacer 160 and may be formed simultaneously with the spacer 160.

The thickness 300TK of the protruding pattern 300 may be smaller than the thickness 140TK of the coupling member 140. The thickness 300TK may mean the maximum thickness of the protruding pattern 300, and the thickness 140TK may mean the maximum thickness of the coupling member 140. The distance 300DT between the upper surface of the protruding pattern 300 and the upper surface of the first base substrate 111 may be smaller than the distance 140DT between the upper surface of the coupling member 140 and the upper surface of the first base substrate 111. In this case, deformation of the shape of the second base substrate 121 during the process of forming the display panel 100 may be prevented by the protruding pattern 300. Details of this will be described later.

In addition, the protruding pattern 300 may prevent foreign matter generated during the cutting process of the preliminary display panel from entering the pads 130. Therefore, it may be possible to prevent the pads 130 from being shorted by a conductive foreign material.

In FIG. 4B, the cutting line CL on which the cutting process is performed is exemplarily illustrated. The cutting line CL may correspond to the side 121e of the second base substrate 121. The protruding pattern 300 may be spaced apart from the cutting line CL. Therefore, in a case that the device may be viewed in the third direction DR3, the protruding pattern 300 may not overlap the second substrate 120. Alternatively, in a case that the device may be viewed in the third direction DR3, the protruding pattern 300 may be spaced apart from the second substrate 120.

Figure 5A:
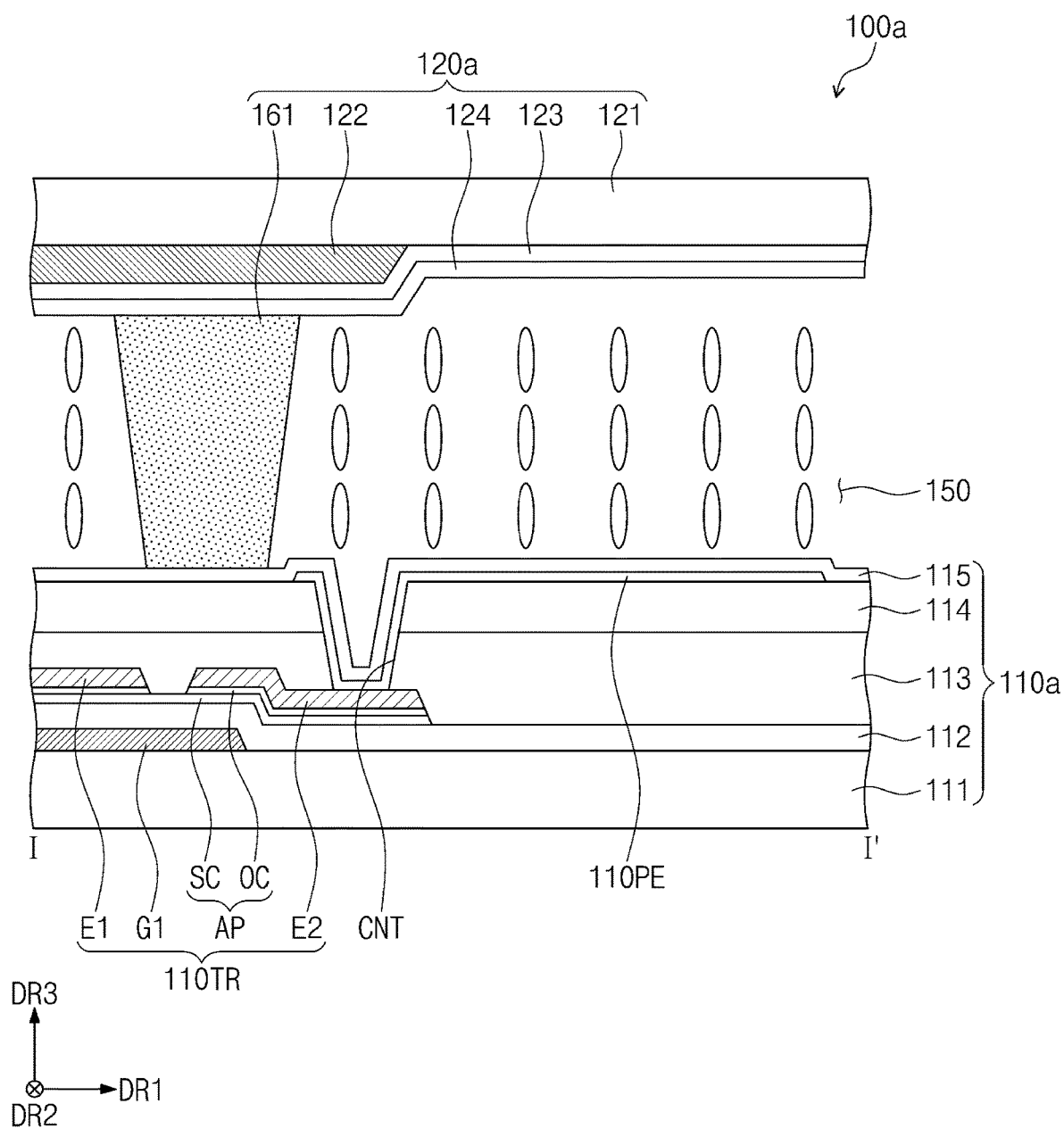
FIG. 5A is a schematic cross-sectional view cut along I-I' in FIG. 1 according to an embodiment
Figure 5B:
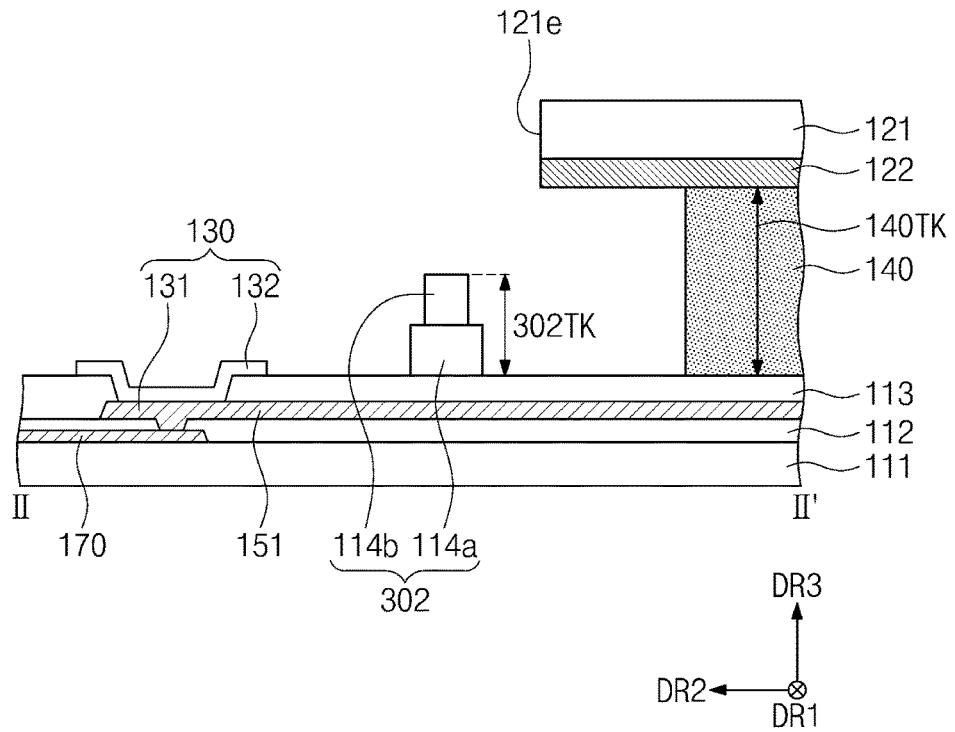
FIG. 5B is a schematic cross-sectional view cut along II-II' in FIG. 2 according to an embodiment

FIG. 5A is a schematic cross-sectional view cut along I-I' in FIG. 1 according to an embodiment. FIG. 5B is a schematic cross-sectional view cut along II-II' in FIG. 2 according to an embodiment.

Referring to FIGS. 5A and 5B, the display panel 100a may include a first substrate 110a, a second substrate 120a, and an image implementation layer 150.

The first substrate 110a may include a first base substrate 111, a transistor 110TR, a first insulating layer 112, a second insulating layer 113, a color filter layer 114, a first electrode 110PE, a first alignment layer 115, pads 130, and a protruding pattern 302.

The second substrate 120a may include a second base substrate 121, a light blocking pattern 122, a second electrode 123, a second alignment layer 124, and a spacer 161. The spacer 161 may be disposed under or below the second alignment layer 124. The first base substrate 111 and the second base substrate 121 may maintain a predetermined distance by the spacer 161. The spacer 161 may have a substantially inverted trapezoidal shape on the schematic cross section, but the shape of the spacer 161 is not limited thereto.

The protruding pattern 302 may include a first layer 114a and a second layer 114b. However, the number of layers constituting the protruding pattern 302 is not limited thereto. For example, the protruding pattern 302 may be composed of a single layer, or may be composed of four or more layers. The thickness 302TK of the protruding pattern 302 may be smaller than the thickness 140TK of the coupling member 140.

Figure 5C:
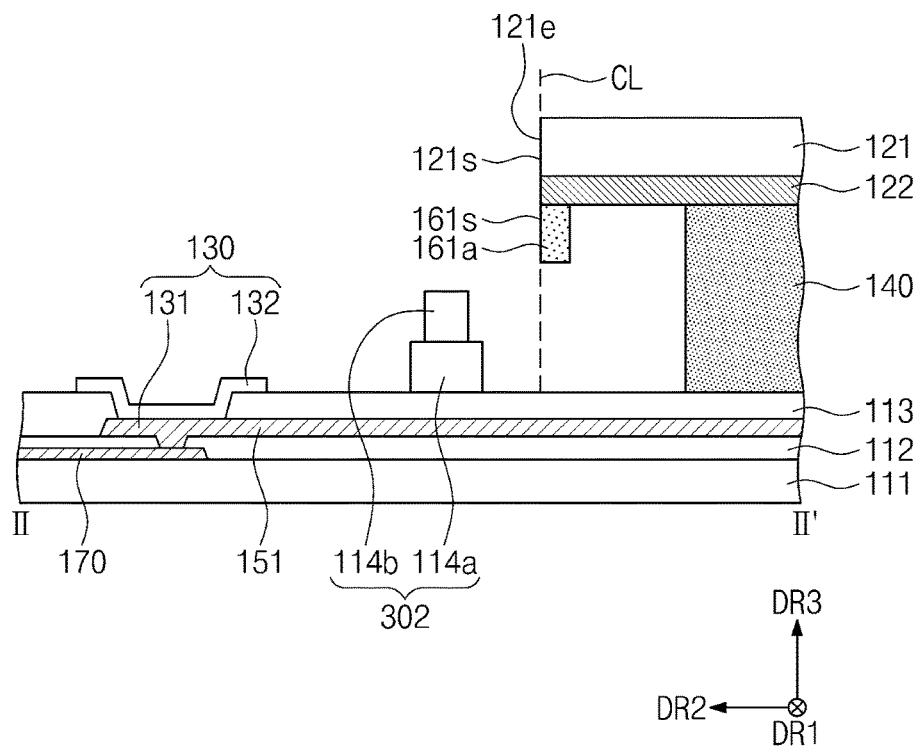
FIG. 5C is a schematic cross-sectional view cut along II-II' in FIG. 2 according to an embodiment

FIG. 5C is a schematic cross-sectional view cut along II-II' in FIG. 2 according to an embodiment.

Referring to FIGS. 5A and 5C, the second substrate 120a may include a protruding pattern 161a. The protruding pattern 161a may be disposed under or below the light blocking pattern 122. For example, the protruding pattern 161a may be disposed on the lower surface of the light blocking pattern 122. The protruding pattern 161a may be referred to as a first protruding pattern.

The protruding pattern 161a may include the same or similar material as the spacer 161 and may be formed simultaneously with the spacer 161. The side surfaces 161s of the protruding pattern 161a may be aligned with the side surfaces 121s of the second base substrate 121. For example, the side surface 161s of the protruding pattern 161a and the side surface 121s of the second base substrate 121 may be aligned with the cutting line CL. For example, a portion of the protruding pattern 161a and a portion of the second base substrate 121 may be removed during the same cutting process, so that the side surface 161s of the protruding pattern 161a and the side surface 121s of the second base substrate 121 may be formed.

Figure 6A:
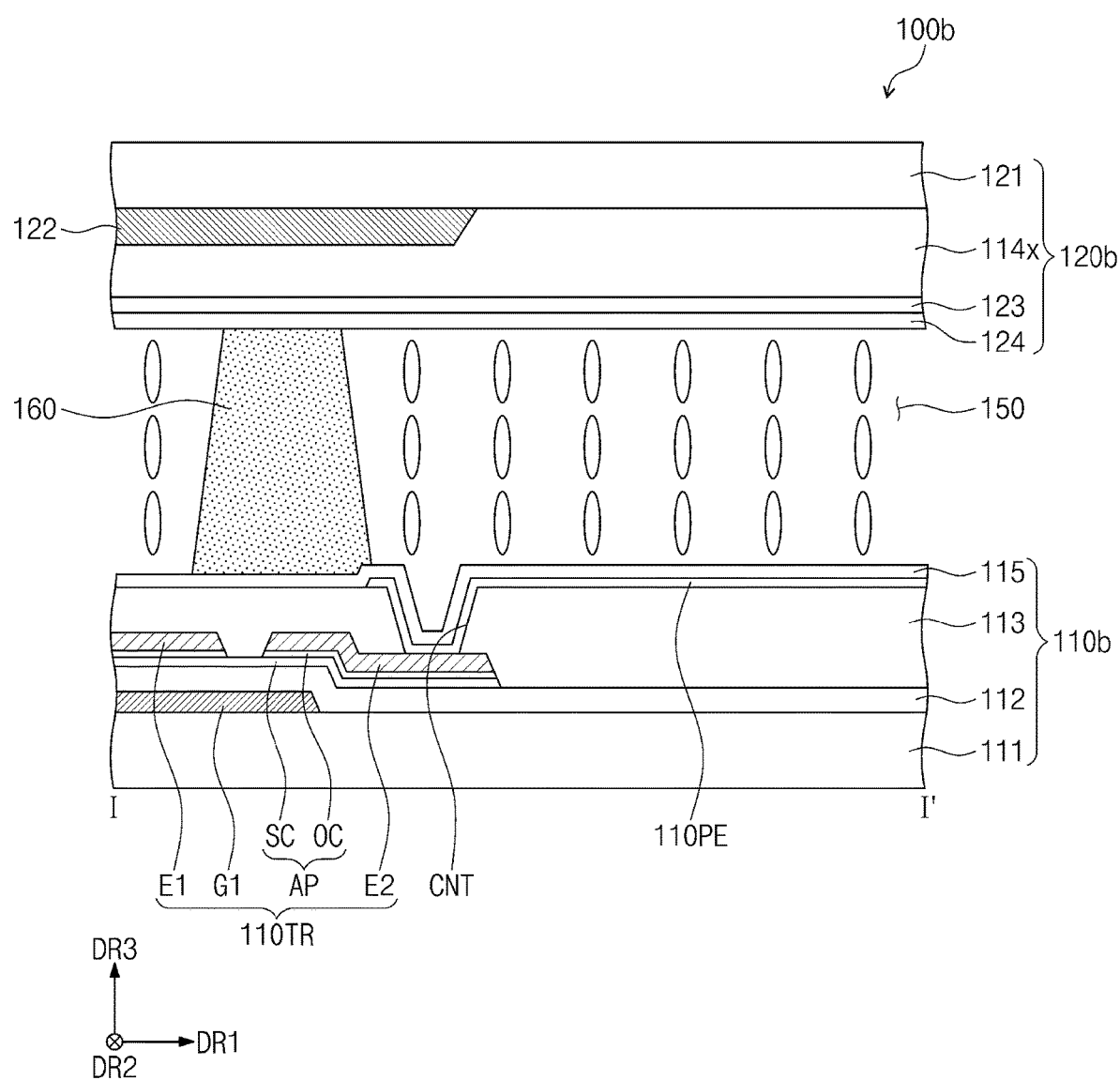
FIG. 6A is a schematic cross-sectional view cut along I-I' in FIG. 1 according to an embodiment.
Figure 6B:
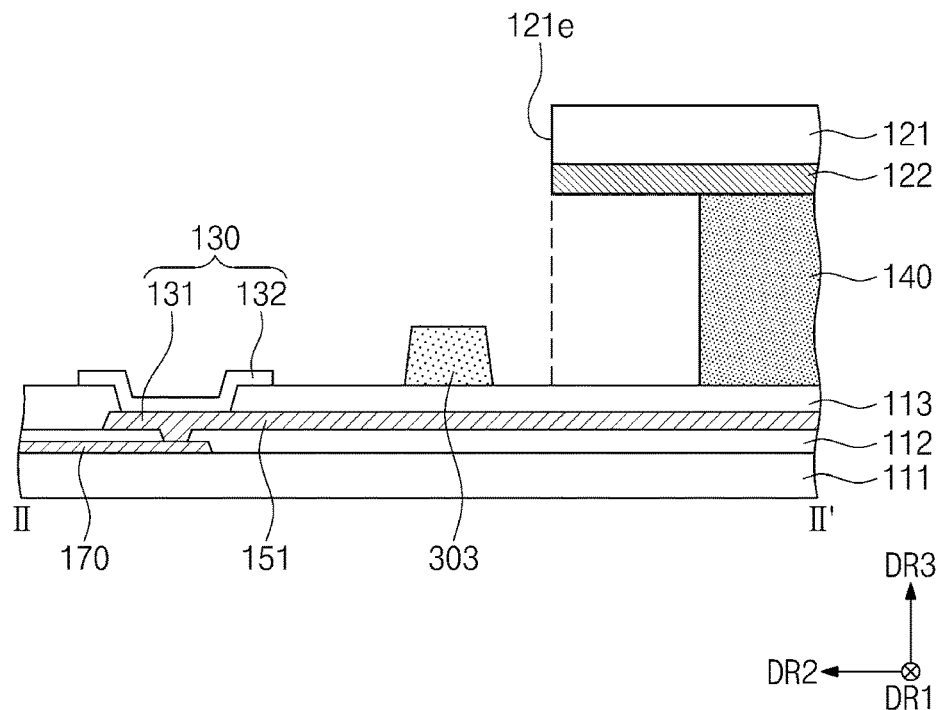
FIG. 6B is a schematic cross-sectional view cut along II-II' in FIG. 2 according to an embodiment

FIG. 6A is a schematic cross-sectional view cut along I-I' in FIG. 1 according to an embodiment. FIG. 6B is a schematic cross-sectional view cut along II-II' in FIG. 2 according to an embodiment Referring to FIGS. 6A and 6B, the display panel 100 may include a first substrate 110b, a second substrate 120b, and an image implementation layer 150.

The first substrate 110b may include a first base substrate 111, a transistor 110TR, a first insulating layer 112, a second insulating layer 113, a first electrode 110PE, a first alignment layer 115, pads 130, a spacer 160, and a protruding pattern 303. The second substrate 120b may include a second base substrate 121, a light blocking pattern 122, a color filter layer 114x, a second electrode 123, and a second alignment layer 124.

The color filter layer 114x may be disposed under or below the second base substrate 121 and may cover or overlap the light blocking pattern 122. The color filter layer 114x may include a green color filter, a blue color filter, and a red color filter. The second electrode 123 may be disposed under or below the color filter layer 114x, and the second alignment layer 124 may be disposed under or below the second electrode 123.

The protruding pattern 303 may be composed of a single layer. For example, the protruding pattern 303 may include the same or similar material as the spacer 160 and may be formed simultaneously with the spacer 160.

Figure 6C:
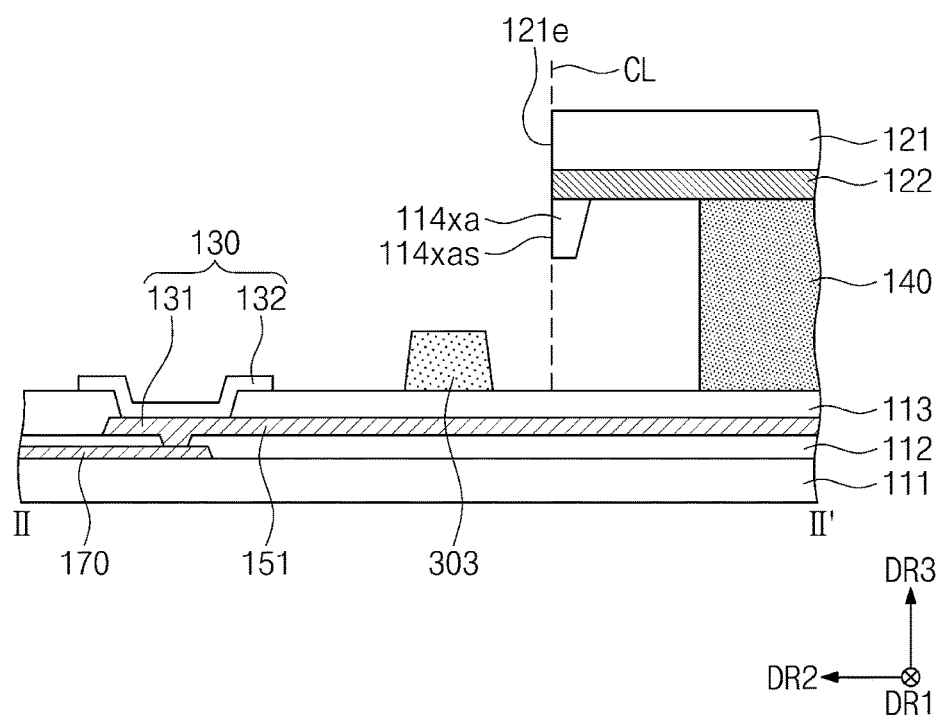
FIG. 6C is a schematic cross-sectional view cut along II-II' in FIG. 2 according to an embodiment

FIG. 6C is a schematic cross-sectional view cut along II-II' in FIG. 2 according to an embodiment.

Referring to FIGS. 6A and 6C, the second substrate 120b may include a protruding pattern 114xa. The protruding pattern 114xa may be disposed under or below the light blocking pattern 122. For example, the protruding pattern 114xa may be disposed on the lower surface of the light blocking pattern 122.

The protruding pattern 114xa may include the same or similar material as the color filter layer 114x, and may be formed simultaneously with the color filter layer 114x. The side surface 114xas of the protruding pattern 114xa may be aligned with the side surfaces 121s of the second base substrate 121. For example, the side surface 114xas of the protruding pattern 114xa and the side surface 121s of the second base substrate 121 may be aligned by the cutting line CL. For example, a portion of the protruding pattern 114xa and a portion of the second base substrate 121 may be removed during the cutting process so that side surfaces 114xas of the protruding pattern 114xa and side surfaces 121s of the second base substrate 121 may be formed.

Figure 6D:
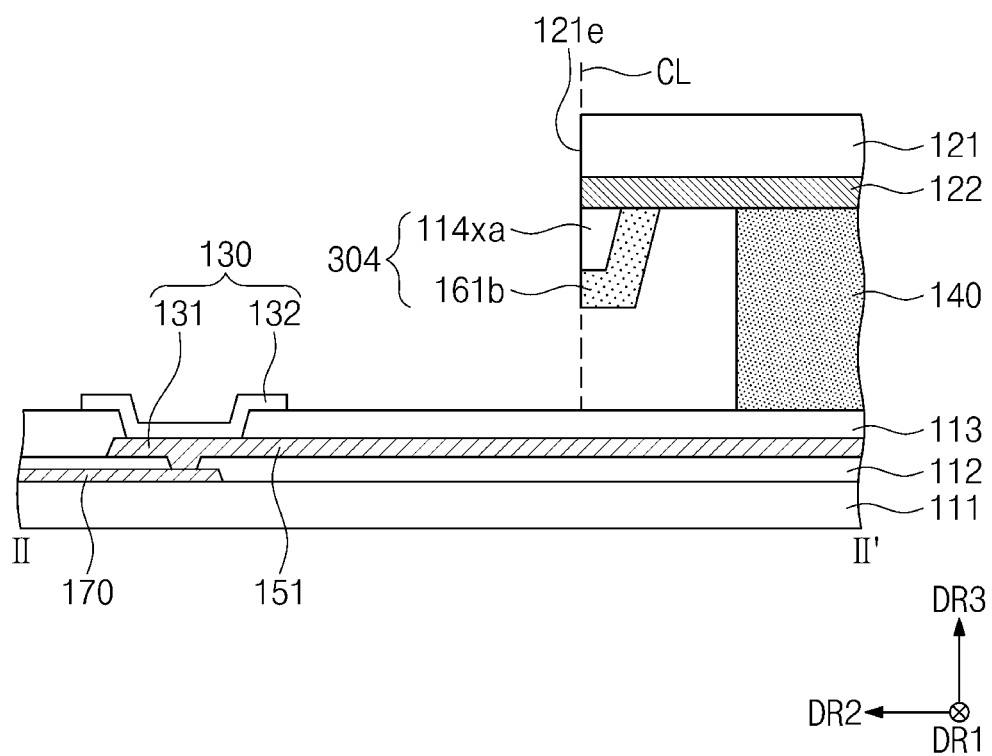
FIG. 6D is a schematic cross-sectional view cut along II-II' in FIG. 2 according to an embodiment.

FIG. 6D is a schematic cross-sectional view cut along II-II' in FIG. 2 according to an embodiment.

Referring to FIG. 6D, in a case that the spacer 160 shown in FIG. 6A is replaced with the spacer 161 shown in FIG. 5A, the protruding pattern 304 may include layers 114xa and 161b. The protruding pattern 304 may include a first layer 114xa and a second layer 161b. The first layer 114xa may include the same or similar material as the color filter layer 114x (see FIG. 6A) and may be formed simultaneously with the color filter layer 114x (see FIG. 6A). The second layer 161b may include the same or similar material as the spacer 161 (see FIG. 5A) and may be formed simultaneously with the spacer 161 (see FIG. 5A).

Figure 7A:
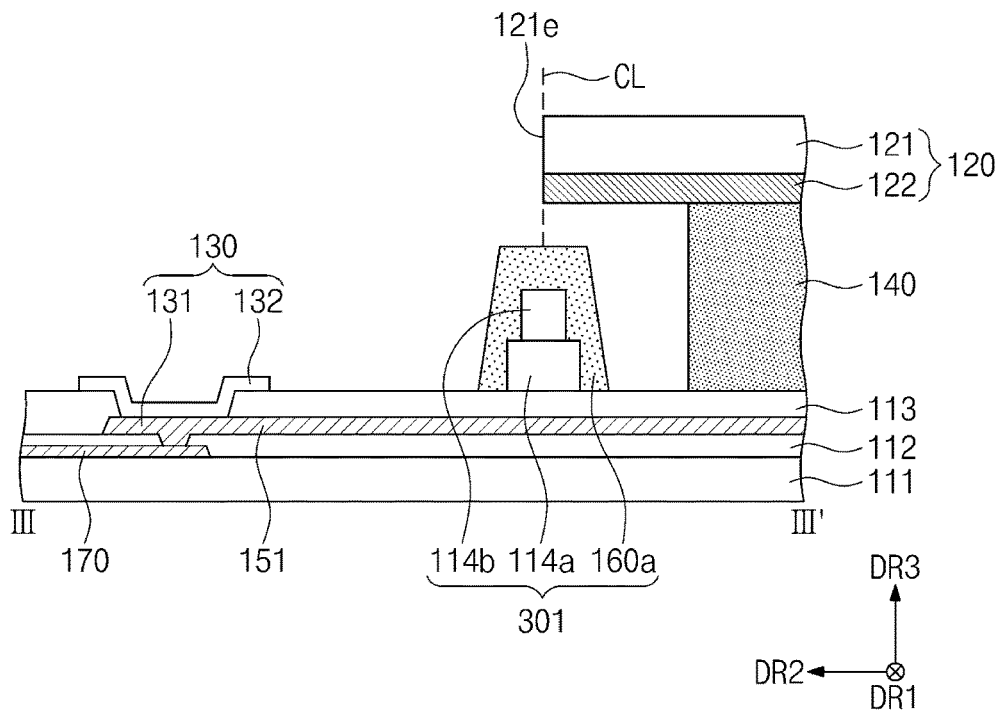
FIG. 7A is a schematic cross-sectional view cut along III-III' in FIG. 3 according to an embodiment.

FIG. 7A is a schematic cross-sectional view cut along III-III' in FIG. 3 according to an embodiment.

Referring to FIGS. 3 and 7A, a portion of the second substrate 120 may be cut along the cutting line CL. The protruding pattern 301 may overlap the cutting line CL. Therefore, the protruding pattern 301 may overlap the side surfaces 121s (see FIG. 7B) of the second base substrate 121. For example, in a case that the device may be viewed in the thickness direction of the second base substrate 121, for example, in the third direction DR3, a portion of the protruding pattern 301 may overlap the second base substrate 121, and another portion of the protruding pattern 301 may not overlap the second base substrate 121.

In the cutting process, the first substrate 110 (see FIG. 4A) may be protected by the protruding pattern 301 overlapping the cutting line CL. In addition, the protruding pattern 301 may prevent foreign matter generated during the cutting process of the preliminary display panel from entering the pads 130.

Figure 7B:
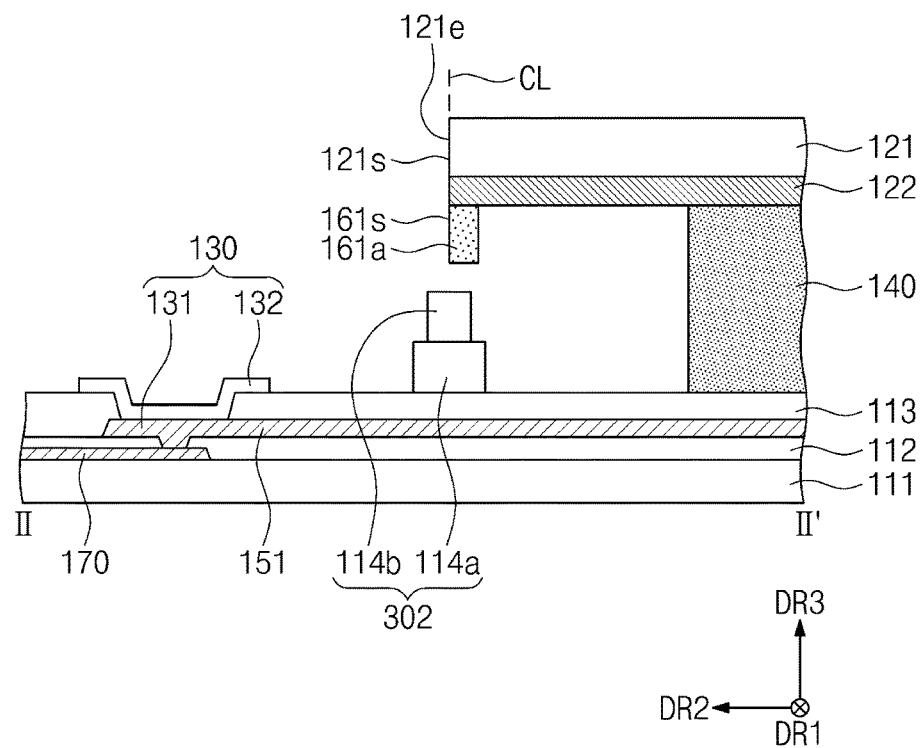
FIG. 7B is a schematic cross-sectional view cut along III-III' in FIG. 3 according to an embodiment.

FIG. 7B is a schematic cross-sectional view cut along III-III' in FIG. 3 according to an embodiment.

Referring to FIGS. 3 and 7B, a portion of the second substrate 120 may be cut along the cutting line CL. The protruding pattern 302 may overlap the cutting line CL. The protruding pattern 302 may overlap the side surface 120s of the second substrate 120 and the side surface 161s of the protruding pattern 161a.

In the cutting process, the first substrate 110 (see FIG. 4A) may be protected by protruding patterns 302 and 161a overlapping the cutting line CL. In addition, the protruding patterns 302 and 161a may prevent foreign matter generated during the cutting process of the preliminary display panel from flowing into the pads 130.

Figure 8:
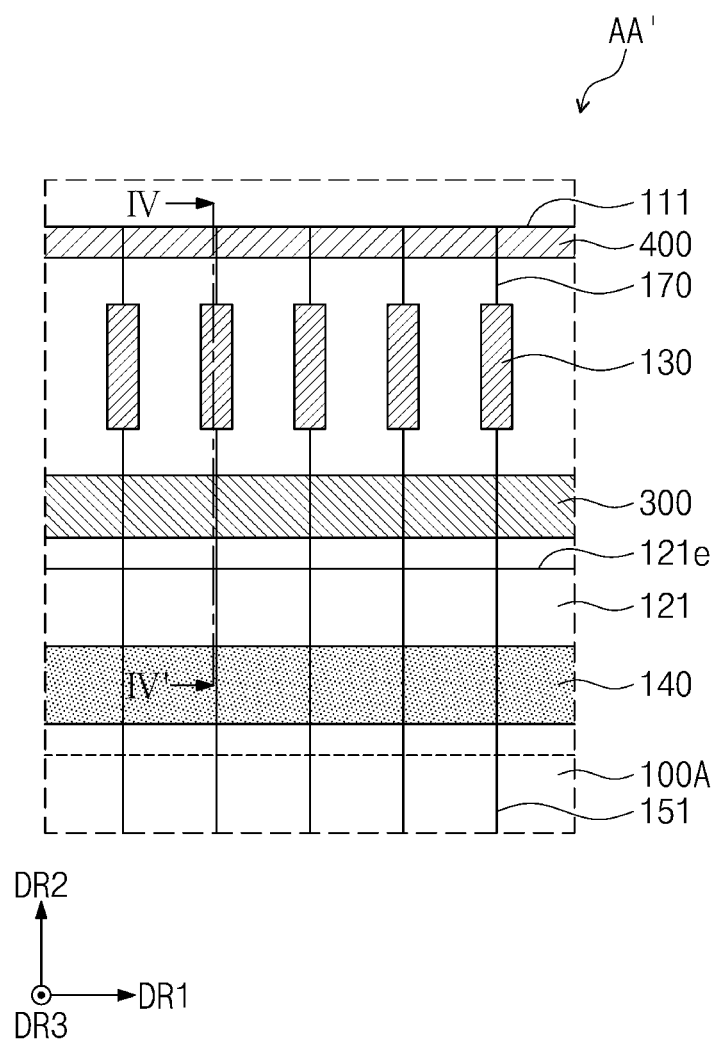
FIG. 8 is a plan view showing an enlarged AA' of FIG. 1 according to an embodiment.
Figure 9:
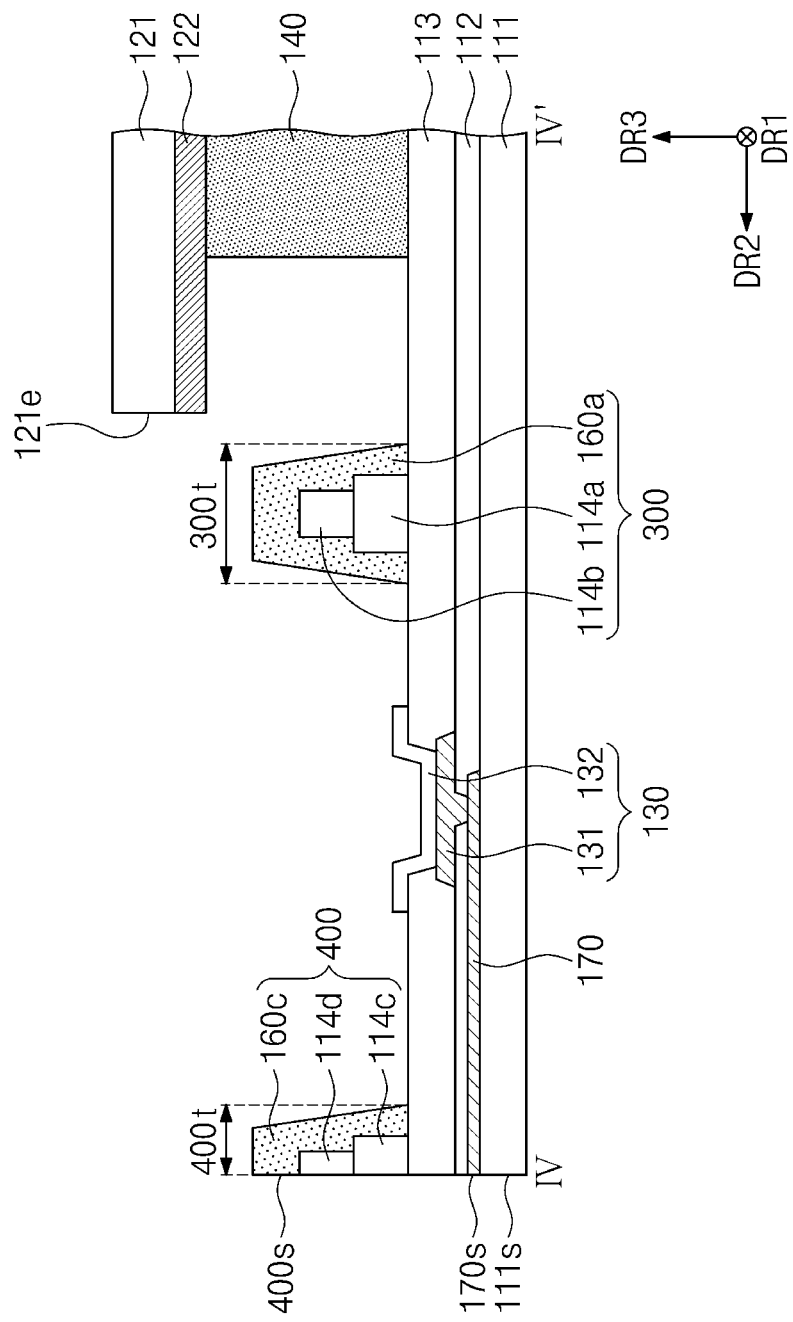
FIG. 9 is a schematic cross-sectional view cut along IV-IV' in FIG. 8 according to an embodiment

FIG. 8 is a plan view according to an embodiment showing an enlarged AA' of FIG. 1. FIG. 9 is a schematic cross-sectional view cut along IV-IV' in FIG. 8 according to an embodiment.

Referring to FIGS. 8 and 9, an additional protruding pattern 400 may be disposed on the first base substrate 111. The additional protruding pattern 400 may be referred to as a second protruding pattern. The additional protruding pattern 400 may be spaced apart from the protruding pattern 300 with the pads 130 interposed therebetween. The protruding pattern 300 and the additional protruding pattern 400 may prevent foreign matter generated during the cutting process of the preliminary display panel from flowing into the pads 130. Deformation of the shape of the second base substrate 121 during the process of forming the display panel 100 may be prevented by the protruding pattern 300 and the additional protruding pattern 400. Details of this will be described later.

The stacking structure of the additional protruding pattern 400 may be the same as the stacking structure of the protruding pattern 300. For example, the additional protruding pattern 400 may include layers 114c, 114d, and 160c. Each of the layers 114c, 114d, and 160c may be simultaneously formed through the same process as each of the corresponding layers 114a, 114b, and 160a.

The additional protruding pattern 400 may extend along the same direction as the arrangement direction of the pads 130. Alternatively, the additional protruding pattern 400 may extend along the same direction as the extending direction of the side surfaces 111s of the first base substrate 111. The pads 130 may be arranged or disposed along the first direction DR1. The side surfaces 111s of the first base substrate 111 may extend along the first direction DR1.

Therefore, the additional protruding pattern 400 may extend along the first direction DR1.

The side surfaces 400s of the additional protruding pattern 400 and the side surfaces 111s of the first base substrate 111 may be formed by the same cutting process. Accordingly, the side surfaces 400s of the additional protruding pattern 400 may be aligned with the side surfaces 111s of the first base substrate 111. The additional protruding pattern 400 may be a residue remaining after a portion of the protruding pattern is cut. Accordingly, the width 400t of the additional protruding pattern 400 may be smaller than the width 300t of the protruding pattern 300. Each of the width 400t of the additional protruding pattern 400 and the width 300t of the protruding pattern 300 may be a width in a direction parallel to the second direction DR2. In addition, the width 400t of the additional protruding pattern 400 is the maximum width of the second direction DR2 of the additional protruding pattern 400, and the width 300t of the protruding pattern 300 may be the maximum width of the second direction DR2.

In an embodiment, the stacking structure of the additional protruding pattern 400 may be different from the stacking structure of the protruding pattern 300 depending on the cutting position. For example, in a case that the layers 114c and 114d are completely removed by a cutting process, the additional protruding pattern 400 may be composed of only one layer 160c. In addition, as illustrated in FIGS. 2 and 3, the additional protruding pattern 400 may be completely removed and not remain on the first base substrate 111.

Figure 10:
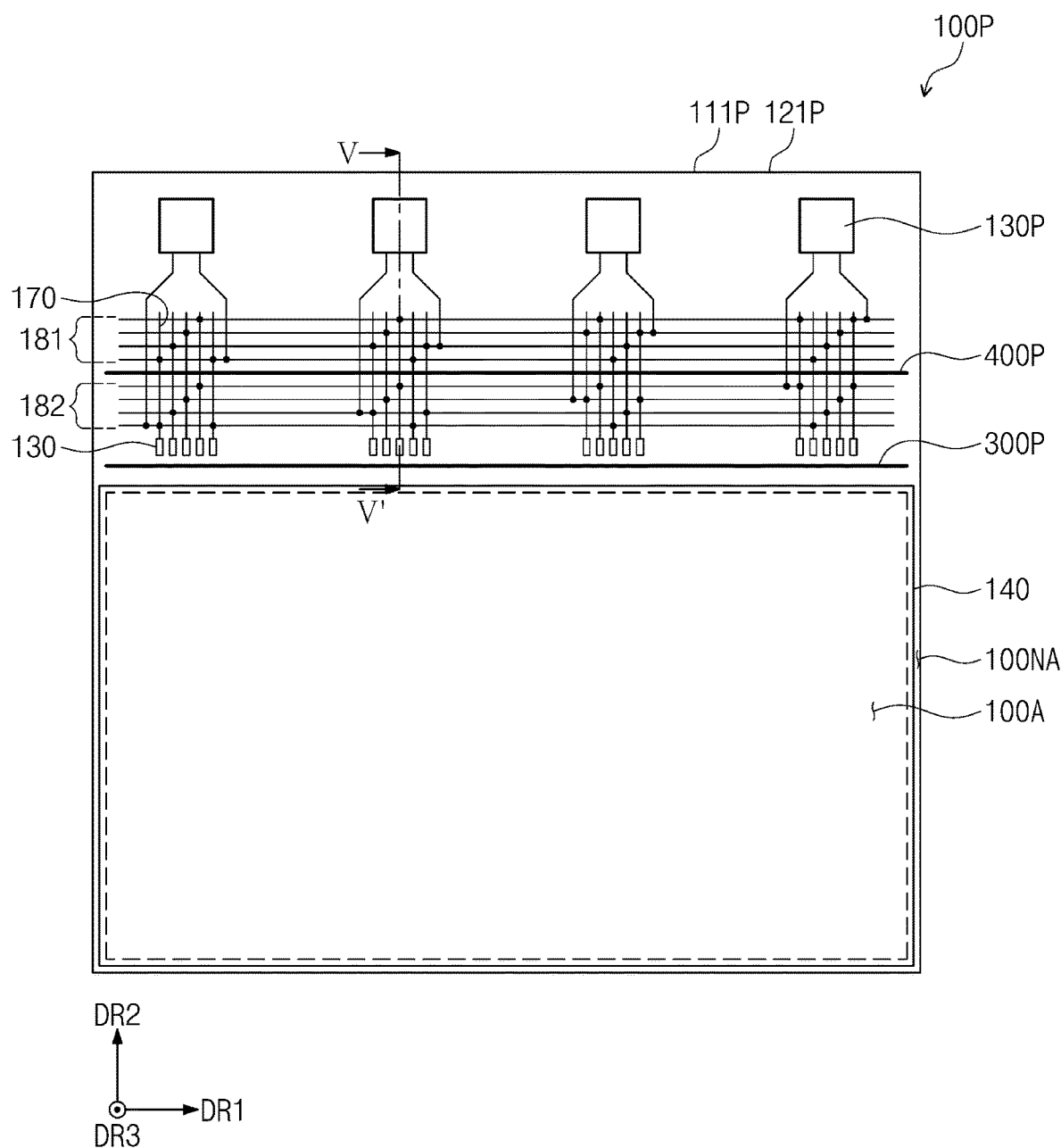
FIG. 10 is a plan view of a display panel according to an embodiment.

The test wiring 170 may extend along a direction away from the protruding pattern 300 from the pad 130. The test wiring 170 may electrically connect the test pad 130P (see FIG. 10) and the pad 130. The test pad 130P may be removed by a cutting process. For example, in a process in which the test pad 130P is removed, a portion of the test wiring 170 may be removed together. The side surfaces 170s of the test wiring 170 may be formed by the same cutting process as the side surfaces 111s of the first base substrate 111. The side surfaces 170s of the test wiring 170 may be aligned with the side surfaces 111s of the base substrate 111. The side surfaces 170s of the test wiring 170 and the outer side surfaces 111os of the display panel 100 (see FIG. 1) may be aligned. FIG. 10 is a plan view of a display panel according to an embodiment. The display panel 100P illustrated in FIG. 10 may be in a state before a cutting process or processes may be performed a plurality of times. The display panel 100P may also be referred to as a preliminary display panel.

Referring to FIG. 10, the display panel 100P may include a first preliminary substrate 111P, a second preliminary substrate 121P, a coupling member 140, a first protruding part 300P, a second protruding part 400P, pads 130 (hereinafter referred to as pads), test pads 130P (hereinafter referred to as test pads), test wirings 170 (hereinafter referred to as test wirings), first connection wirings 181, (hereinafter referred to as the first connection wirings) and second connection wirings 182 (hereinafter referred to as second connection wirings). The first protruding part 300P may have a configuration corresponding to the protruding pattern 300 (see FIG. 1) described above.

The first preliminary substrate 111P and the second preliminary substrate 121P may have substantially the same size. The coupling member 140, the first protruding part 300P, the second protruding part 400P, the pads 130, the test pads 130P, the test wirings 170, the first connection wirings 181, and the second connection wirings 182 may be disposed between the first preliminary substrate 111P and the second preliminary substrate 121P.

The test wirings 170 may respectively extend from the pads 130. For example, test wirings 170 may extend in a direction away from the pads 130 to the active area 100A.

The first connection wirings 181 and the second connection wirings 182 may extend along a direction intersecting the test wirings 170. For example, in a case that the test wirings 170 extend along the second direction DR2, each of the first connection wirings 181 and the second connection wirings 182 may extend along the first direction DR1. Each of the first connection wirings 181 may be electrically connected to corresponding test wirings among test wirings 170, and each of the second connection wirings 182 may be electrically connected to corresponding test wirings among the test wirings 170.

In a case that the device may be viewed in the third direction DR3, the first protruding part 300P may be disposed between the coupling member 140 and the pads 130, and the second protruding part 400P may be disposed between the pads 130 and the test pads 130P. The second protruding part 400P may be disposed between the first connection wirings 181 and the second connection wirings 182.

Figure 11:
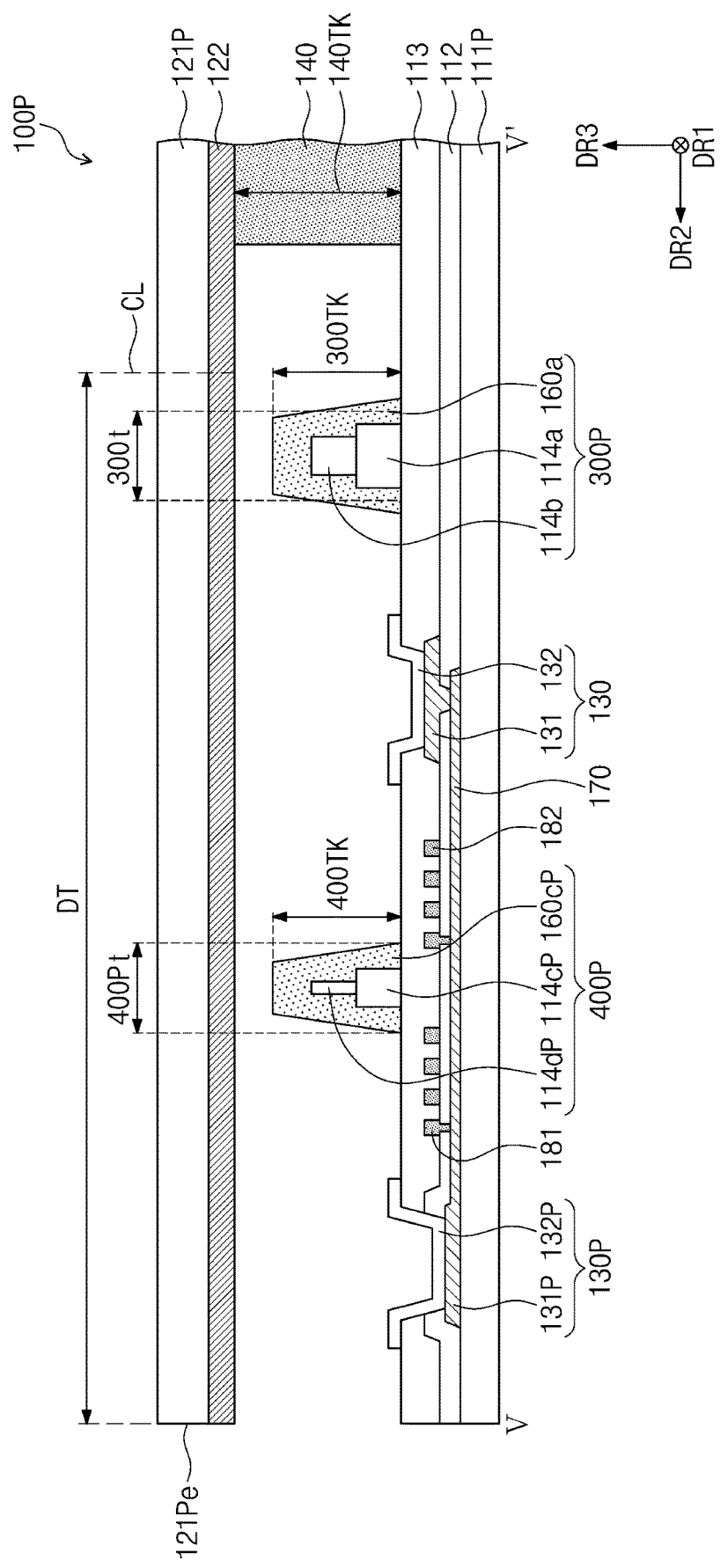
FIG. 11 is a schematic cross-sectional view cut along V-V' in FIG. 10 according to an embodiment.

FIG. 11 is a schematic cross-sectional view cut along V-V' in FIG. 10 according to an embodiment. The display panel 100P illustrated in FIG. 11 may be cut a plurality of times to become the display panel 100 illustrated in FIGS. 4A and 4B.

Referring to FIG. 11, the pad 130 may be electrically connected to the test pad 130P through the test wiring 170, and the test pad 130P includes test pad patterns 131P and 132P. One test wiring 170 may be electrically connected to one first connection wiring 181 and one second connection wiring 182. Each of the first connection wiring 181, the second connection wiring 182, and the pad 130 may penetrate the first insulating layer 112 to be electrically contacted with one test wiring 170.

The first protruding part 300P and the second protruding part 400P may be disposed between the first preliminary substrate 111P and the second preliminary substrate 121P.

The first protruding part 300P and the second protruding part 400P may prevent foreign matter generated during the process of cutting a portion of the display panel 100P from flowing into the pads 130. Therefore, it may be possible to prevent the pads 130 from being shorted by a conductive foreign material. Accordingly, manufacturing yields of the display panel 100 (see FIG. 1) and the display device 1000 (see FIG. 1) may be improved.

During the process of forming the display panel 100 (see FIG. 1), the second preliminary substrate 121P may be prevented from being sagged by the first protruding part 300P and the second protruding part 400P. For example, the distance DT from the cutting line CL to the end part 121Pe of the second preliminary substrate 121P may be about 5.6 mm. Under the second preliminary substrate 121P, the first protruding part 300P and the second protruding part 400P may be disposed in a space between the second preliminary substrate 121P and the first preliminary substrate 111P so that the second preliminary substrate 121P may be prevented from sagging. Therefore, the deformation of the shape of the second preliminary substrate 121P may be reduced, and accordingly, luminance unevenness due to a cell gap difference is reduced or eliminated in the active area 100A (see FIG. 1) of the display panel 100 (see FIG. 1) so that the image quality enhanced display panel 100 (see FIG. 1) and the display device 1000 (see FIG. 1) may be provided.

Different from the embodiments, in a case that the thickness 300TK of the first protruding part 300P and the thickness 400TK of the second protruding part 400P are greater than the thickness 140TK of the coupling member 140, the second preliminary substrate 121P may be lifted by the first protruding part 300P and the second protruding part 400P. What the second preliminary substrate 121P is lifted means that the distance between the first preliminary substrate 111P and the second preliminary substrate 121P is greater than the reference distance.

In a case that the second preliminary substrate 121P is lifted in an active area 100A, the cell gap in the active area 100A (see FIG. 1) may be changed, which may cause luminance unevenness. According to an embodiment, the thickness 300TK of the first protruding part 300P may be smaller than the thickness 140TK of the coupling member 140, and the thickness 400TK of the second protruding part 400P may be smaller than the thickness 140TK of the coupling member 140. Even considering process errors, the probability that the first protruding part 300P or the second protruding part 400P lifts the second preliminary substrate 121P may be minimized. Luminance unevenness due to cell gap change may be reduced or eliminated. Also, the width 300t of the first protruding part 300P may be greater than the width 400Pt of the second protruding part 400P.

Figure 12:
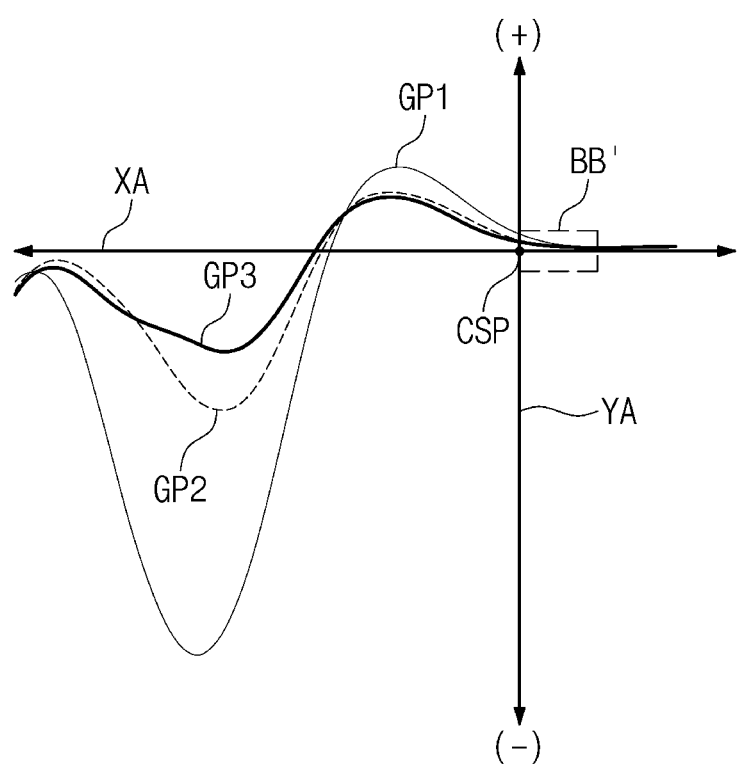
FIG. 12 shows graphs showing the bending of the second base substrate.

FIG. 12 shows graphs showing the degree of bending of the second base substrate.

Referring to FIGS. 11 and 12, the horizontal axis XA and the vertical axis YA are defined.

In the horizontal axis XA, the point CSP where the horizontal axis XA and the vertical axis YA may cross or intersect may correspond to the boundary between the active area 100A and the peripheral area 100NA. The right area may be the active area 100A and the left area may be the peripheral area 100NA based on the horizontal axis XA and the point CSP.

In the vertical axis YA, the point CSP where the horizontal axis XA and the vertical axis YA may cross or intersect may be a reference distance between the first preliminary substrate 111P and the second preliminary substrate 121P. The reference distance is a designed value and may have a predetermined value. A positive value on the vertical axis YA may mean that the distance between the first preliminary substrate 111P and the second preliminary substrate 121P is greater than the reference distance, and a negative value on the vertical axis YA may mean that the distance between the first preliminary substrate 111P and the second preliminary substrate 121P is less than the reference distance.

The first graph GP1 is a graph that shows the difference between the reference distance and the distance between the first preliminary substrate 111P and the second preliminary substrate 121P according to the location in the case of the comparative example without both the first protruding part 300P and the second protruding part 400P. The second graph GP2 is a graph that shows the difference between the reference distance and the distance between the first preliminary substrate 111P and the second preliminary substrate 121P according to the location in the case of the first embodiment in which the first protruding part 300P may be disposed between the first preliminary substrate 111P and the second preliminary substrate 121P. The third graph GP3 is a graph that shows the difference between the reference distance and the distance between the first preliminary substrate 111P and the second preliminary substrate 121P according to the position in the case of the second embodiment in which the first protruding part 300P and the second protruding part 400P are disposed between the first preliminary substrate 111P and the second preliminary substrate 121P.

The distance between the first preliminary substrate 111P and the second preliminary substrate 121P in a region may be more reduced than the reference distance. As the reference distance decreases, in another region, a phenomenon in which the second preliminary substrate 121P is lifted, for example, a phenomenon in which the second preliminary substrate 121P is away from the first preliminary substrate 111P, may occur.

Compared to the second graph GP2 and the third graph GP3, the first graph GP1 may have a large change in distance between the first preliminary substrate 111P and the second preliminary substrate 121P according to the location. However, according to an embodiment, the second preliminary substrate 121P may be supported by the first protruding part 300P or the first and second protruding parts 300P and 400P so that the degree of sagging of the second preliminary substrate 121P may be reduced. In a case that the first protruding part 300P may be disposed between the first preliminary substrate 111P and the second preliminary substrate 121P, or in a case that the first protruding part 300P and the second protruding part 400P are disposed between the first preliminary substrate 111P and the second preliminary substrate 121P, compared to the case where there is no first protruding part 300P and second protruding part 400P, the width of the distance change according to the position may be reduced.

Figure 13:
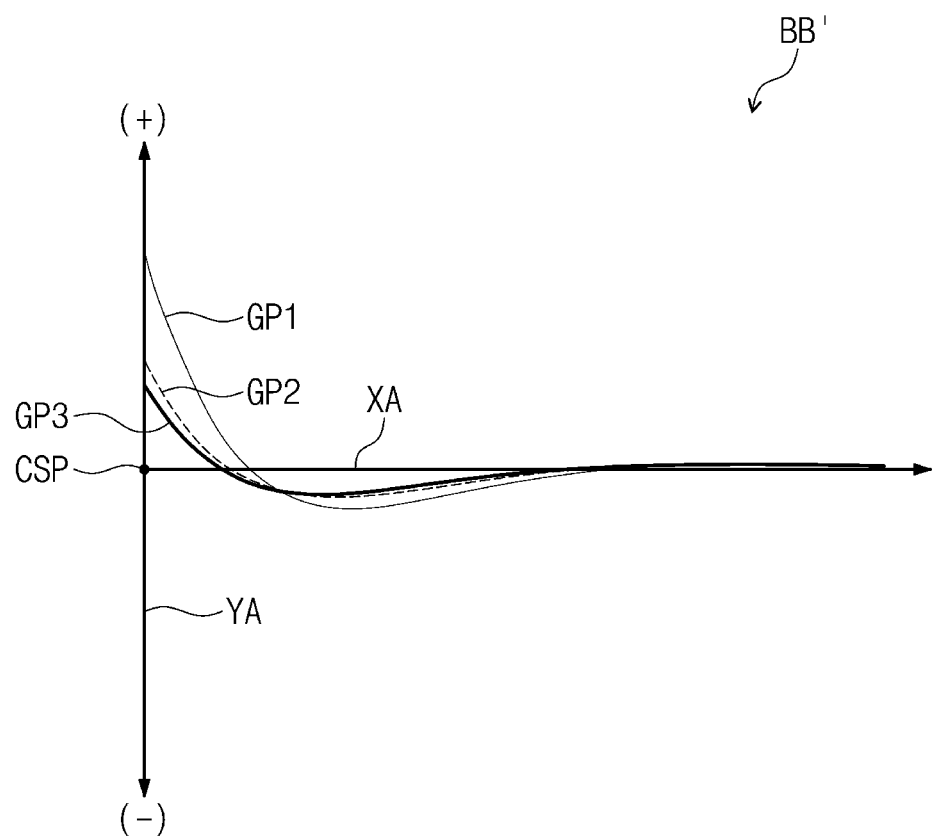
FIG. 13 shows graphs showing the bending of the second base substrate.

FIG. 13 is an enlarged view of the area BB' of FIG. 12. For example, FIG. 13 is an enlarged view of a portion showing a difference between a reference distance and a distance between the first preliminary substrate 111P and the second preliminary substrate 121P in the active area 100A.

Referring to FIGS. 11, 12, and 13, the maximum value in the first graph GP1 is greater than the maximum value in the second graph GP2 and the maximum value in the third graph GP3. Therefore, in the comparative example, a stain brighter than the reference luminance may be generated compared to the first and second embodiments. Also, the minimum value of the first graph GP1 is smaller than the minimum value of the second graph GP2 and the minimum value of the third graph GP3. Therefore, in the comparative example, a stain darker than the reference luminance may be generated compared to the first and second embodiments.

According to an embodiment, as the first protruding part 300P and the second protruding part 400P are disposed, luminance unevenness due to a change in cell gap may be reduced. Accordingly, the display panel 100 with improved image quality (see FIG. 1) may be provided.

Figure 14:
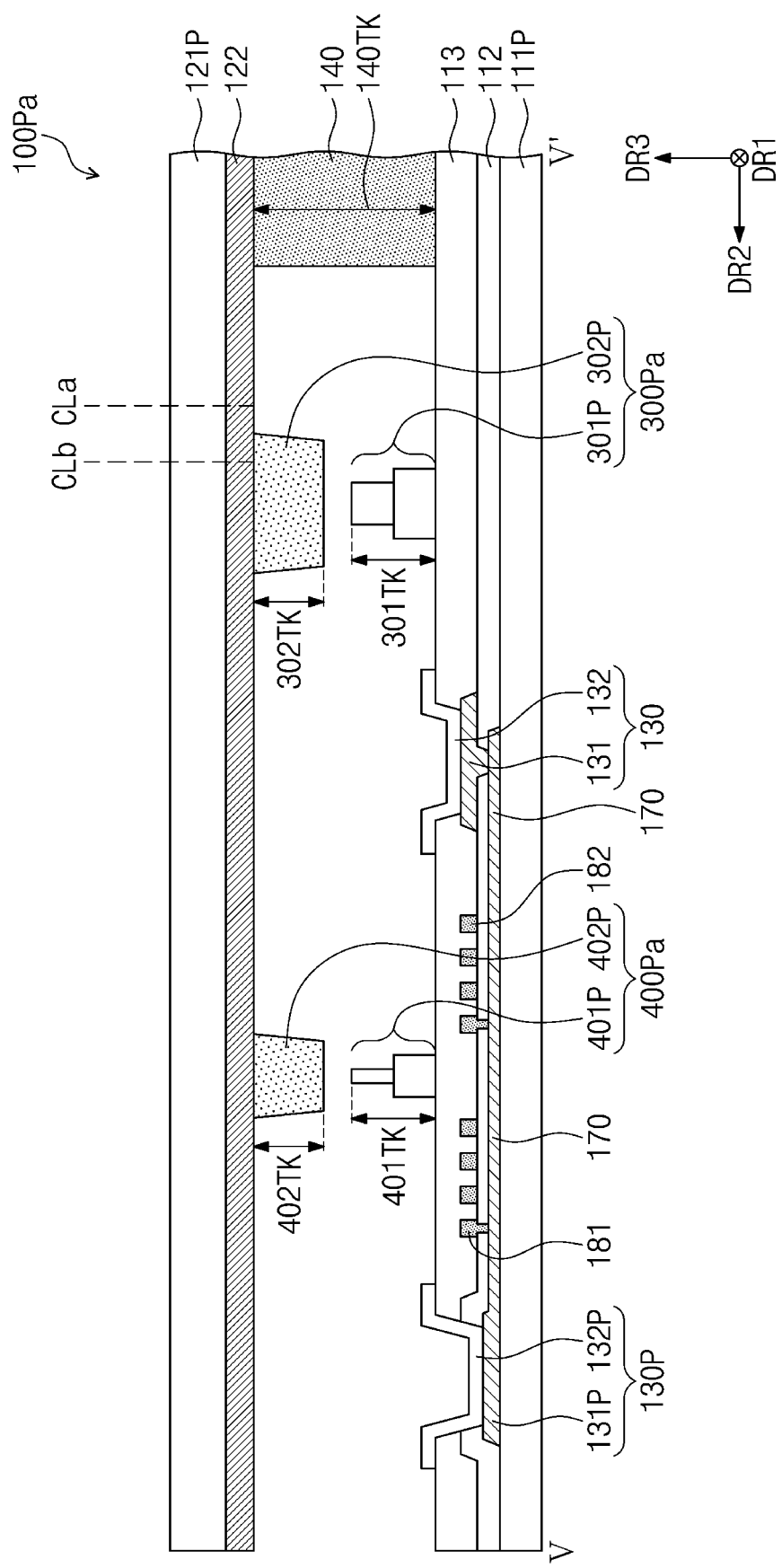
FIG. 14 is a schematic cross-sectional view cut along V-V' in FIG. 10 according to an embodiment.

FIG. 14 is a schematic cross-sectional view cut along V-V' in FIG. 10 according to an embodiment.

The display panel 100Pa illustrated in FIG. 14 may be in a state before a cutting processes are performed a plurality of times. For example, the display panel 100Pa illustrated in FIG. 14 may be cut a plurality of times to become the display panel 100a illustrated in FIGS. 5A and 5B or the display panel 100A illustrated in FIGS. 5A and 5C. For example, in a case that a portion of the display panel 100Pa is cut along the first cutting line CLa, the display panel illustrated in FIG. 5B may be formed. Alternatively, in a case that a portion of the display panel 100Pa is cut along the second cutting line CLb, it may be the display panel illustrated in FIG. 5C. The display panel 100Pa may also be referred to as a preliminary display panel.

The first protruding part 300Pa and the second protruding part 400Pa may be disposed between the first preliminary substrate 111P and the second preliminary substrate 121P. The first protruding part 300Pa may include a first protruding pattern 301P and a second protruding pattern 302P, and the second protruding part 400Pa may include a third protruding pattern 401P and a fourth protruding pattern 402P. The first protruding pattern 301P and the third protruding pattern 401P may be disposed on the first preliminary substrate 111P, and the second protruding pattern 302P and the fourth protruding pattern 402P may be disposed under or below the second preliminary substrate 121P. The first protruding pattern 301P and the second protruding pattern 302P may be spaced apart from each other, and the third protruding pattern 401P and the fourth protruding pattern 402P may be spaced apart from each other.

At least one of the first protruding pattern 301P and the second protruding pattern 302P may include layers stacked in the thickness direction of the first preliminary substrate 111P, for example, in the third direction DR3. For example, the first protruding pattern 301P may include layers. The third protruding pattern 401P may have the same stacking structure as the first protruding pattern 301P, and the fourth protruding pattern 402P may have the same stacking structure as the second protruding pattern 302P.

The thickness of the first protruding part 300Pa may be defined as the sum of the thickness 301TK of the first protruding pattern 301P and the thickness 302TK of the second protruding pattern 302P, and the thickness of the second protruding part 400Pa may be defined as the sum of the thickness 401TK of the third protruding pattern 401P and the thickness 402TK of the fourth protruding pattern 402P. The thickness of the first protruding part 300Pa may be smaller than the thickness 140TK of the coupling member 140, and the thickness of the second protruding part 400Pa may be smaller than the thickness 140TK of the coupling member 140.

Figure 15:
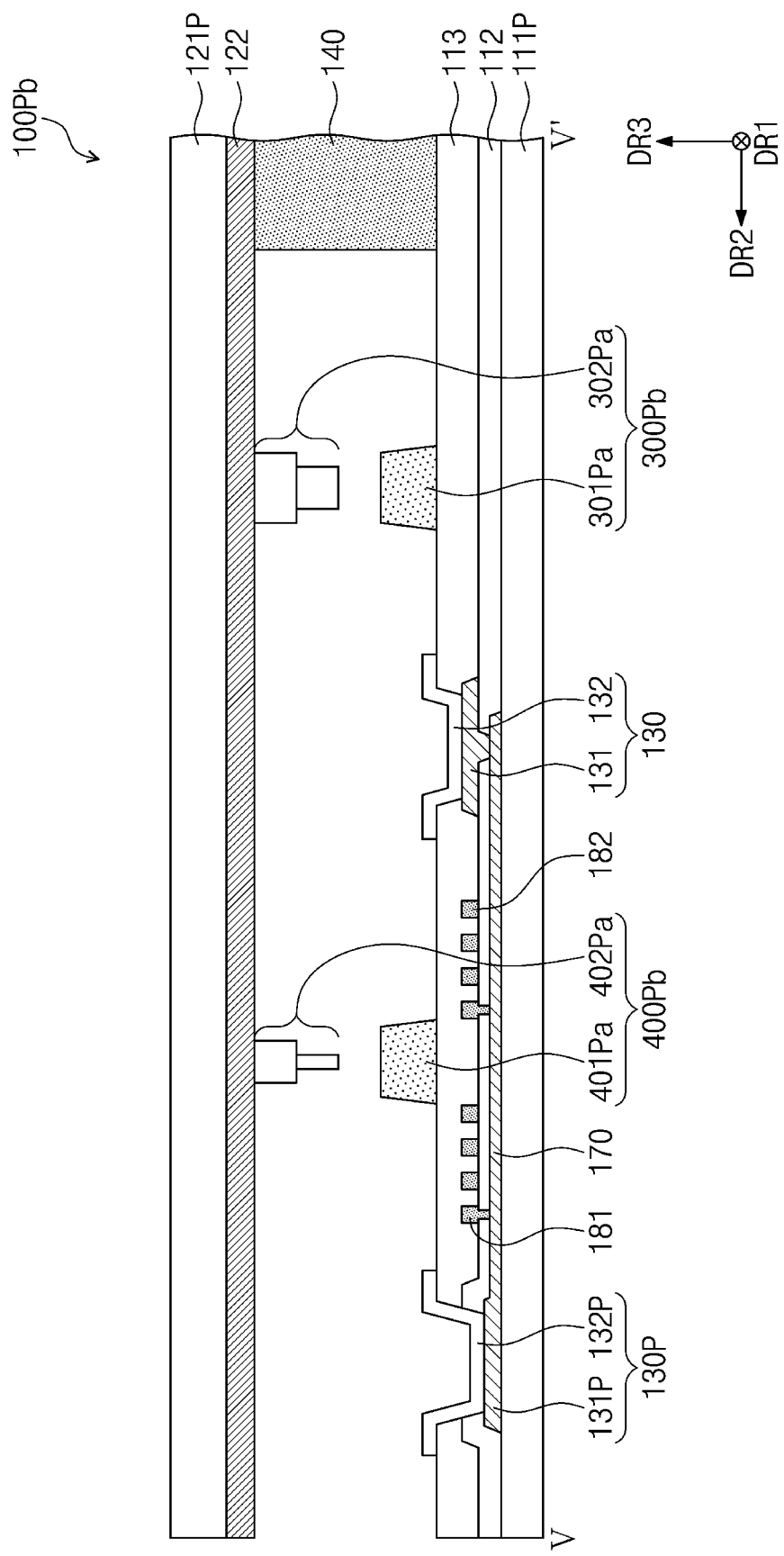
FIG. 15 is a schematic cross-sectional view cut along V-V' in FIG. 10 according to an embodiment.

FIG. 15 is a schematic cross-sectional view cut along V-V' in FIG. 10 according to an embodiment.

The display panel 100Pb illustrated in FIG. 15 may be in a state before a cutting processes are performed a plurality of times. For example, the display panel 100Pb illustrated in FIG. 15 may be cut a plurality of times to become the display panel 100b illustrated in FIGS. 6A and 6B. The display panel 100Pb may also be referred to as a preliminary display panel.

The first protruding part 300Pb and the second protruding part 400Pb may be disposed between the first preliminary substrate 111P and the second preliminary substrate 121P. The first protruding part 300Pb may include a first protruding pattern 301Pa and a second protruding pattern 302Pa, and the second protruding part 400Pb may include a third protruding pattern 401Pa and a fourth protruding pattern 402Pa. The first protruding pattern 301Pa and the third protruding pattern 401Pa may be disposed on the first preliminary substrate 111P, and the second protruding pattern 302Pa and the fourth protruding pattern 402Pa may be disposed under or below the second preliminary substrate 121P. The first protruding pattern 301Pa and the second protruding pattern 302Pa may be spaced apart from each other, and the third protruding pattern 401Pa and the fourth protruding pattern 402Pa may be spaced apart from each other.

The first protruding pattern 301Pa and the third protruding pattern 401Pa may be composed of a single layer, and the second protruding pattern 302Pa and the fourth protruding pattern 402Pa may include layers. The fourth protruding pattern 402Pa may have the same stacking structure as the second protruding pattern 302Pa.

Figure 16:
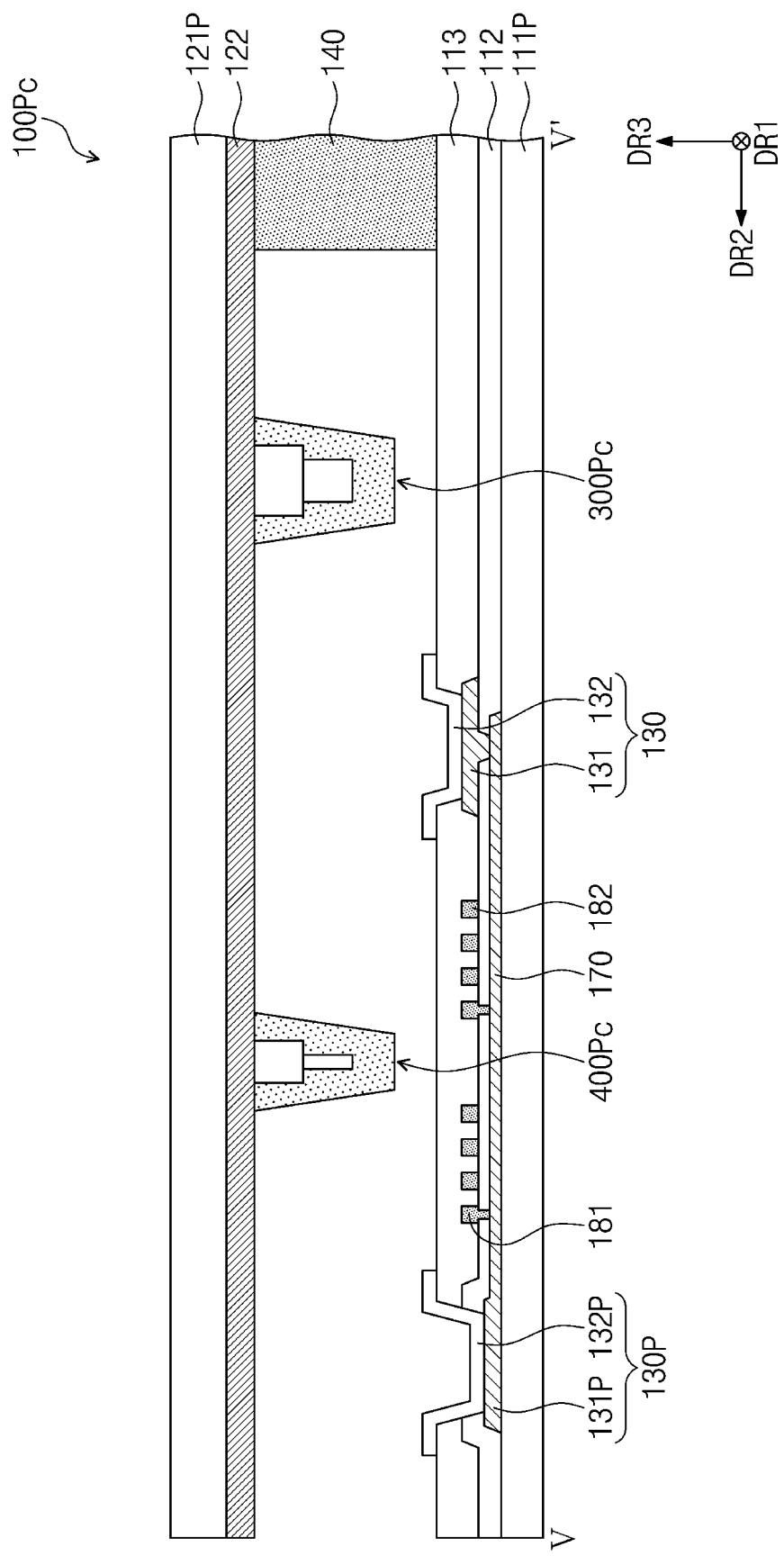
FIG. 16 is a schematic cross-sectional view cut along V-V' in FIG. 10 according to an embodiment.

FIG. 16 is a schematic cross-sectional view cut along V-V' in FIG. 10 according to an embodiment. The display panel 100Pc illustrated in FIG. 16 may be in a state before a cutting processes are performed a plurality of times. The display panel 100Pc may also be referred to as a preliminary display panel.

Referring to FIG. 16, the first protruding part 300Pc and the second protruding part 400Pc may be disposed between the first preliminary substrate 111P and the second preliminary substrate 121P. For example, the first protruding part 300Pc and the second protruding part 400Pc may be disposed on the lower surface of the light blocking pattern 122, and the first protruding part 300Pc and the second protruding part 400Pc may be spaced apart from the second insulating layer 113.

Figure 17:
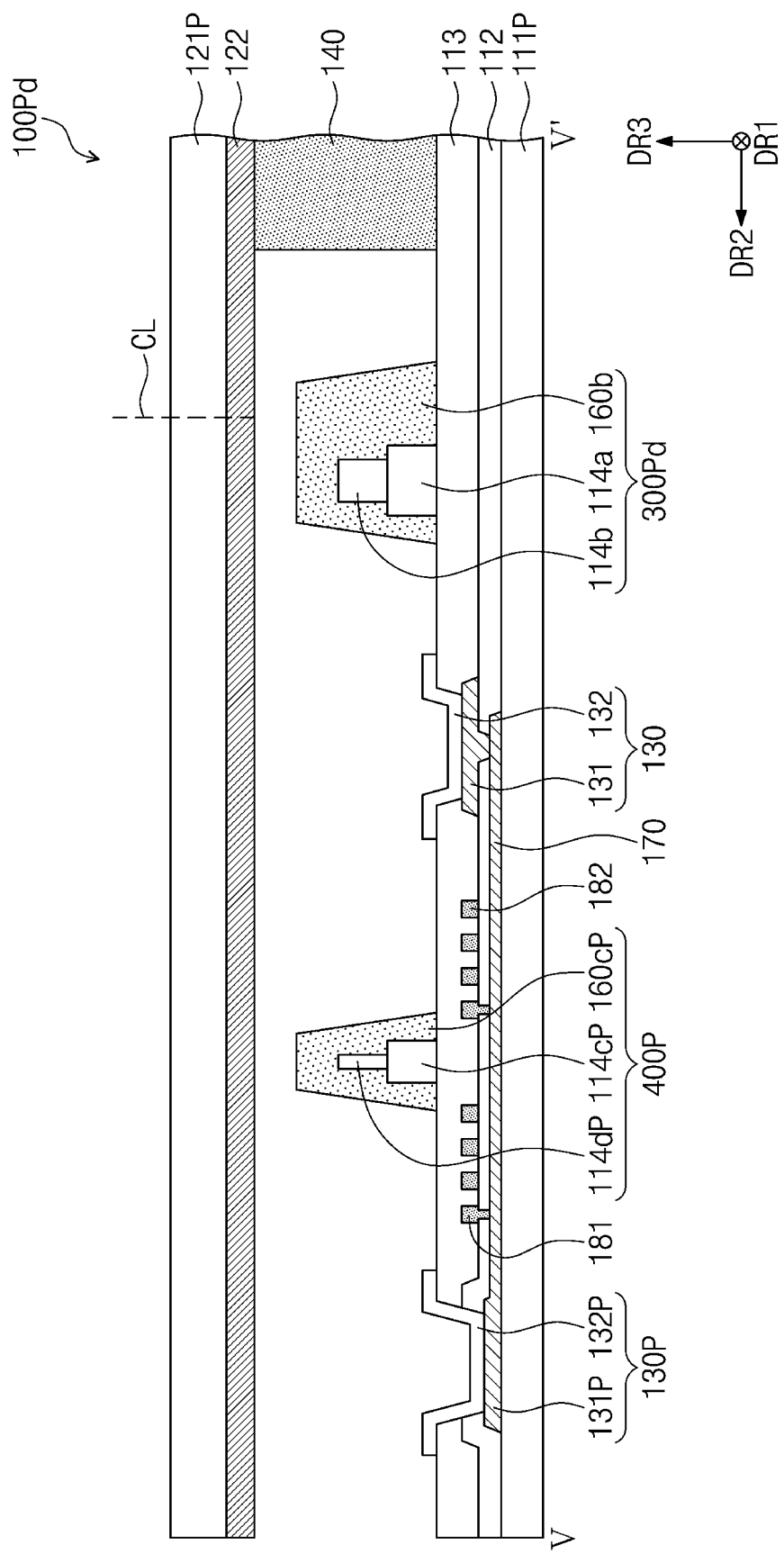
FIG. 17 is a schematic cross-sectional view cut along V-V' in FIG. 10 according to an embodiment.

FIG. 17 is a schematic cross-sectional view cut along V-V' in FIG. 10 according to an embodiment. In the description of FIG. 17, the same reference numerals are given to the same components as those described with reference to FIG. 11, and a description thereof will be omitted.

Referring to FIG. 17, the first protruding part 300Pd of the display panel 100Pd may overlap the cutting line CL. For example, the third layer 160b may have a more extended shape toward the coupling member 140. Referring to FIG. 17, the second protruding part 400P may include layers 114dP, 114cP, and 160cP.

In the cutting process, components disposed under or below the third layer 160b may be protected by the third layer 160b overlapping the cutting line CL. In addition, foreign matters may be prevented from flowing into the pads 130 by the first protruding part 300Pd.

FIGS. 18, 19, 20A, and 20B are schematic cross-sectional views illustrating processes for manufacturing a display panel.

Figure 18:
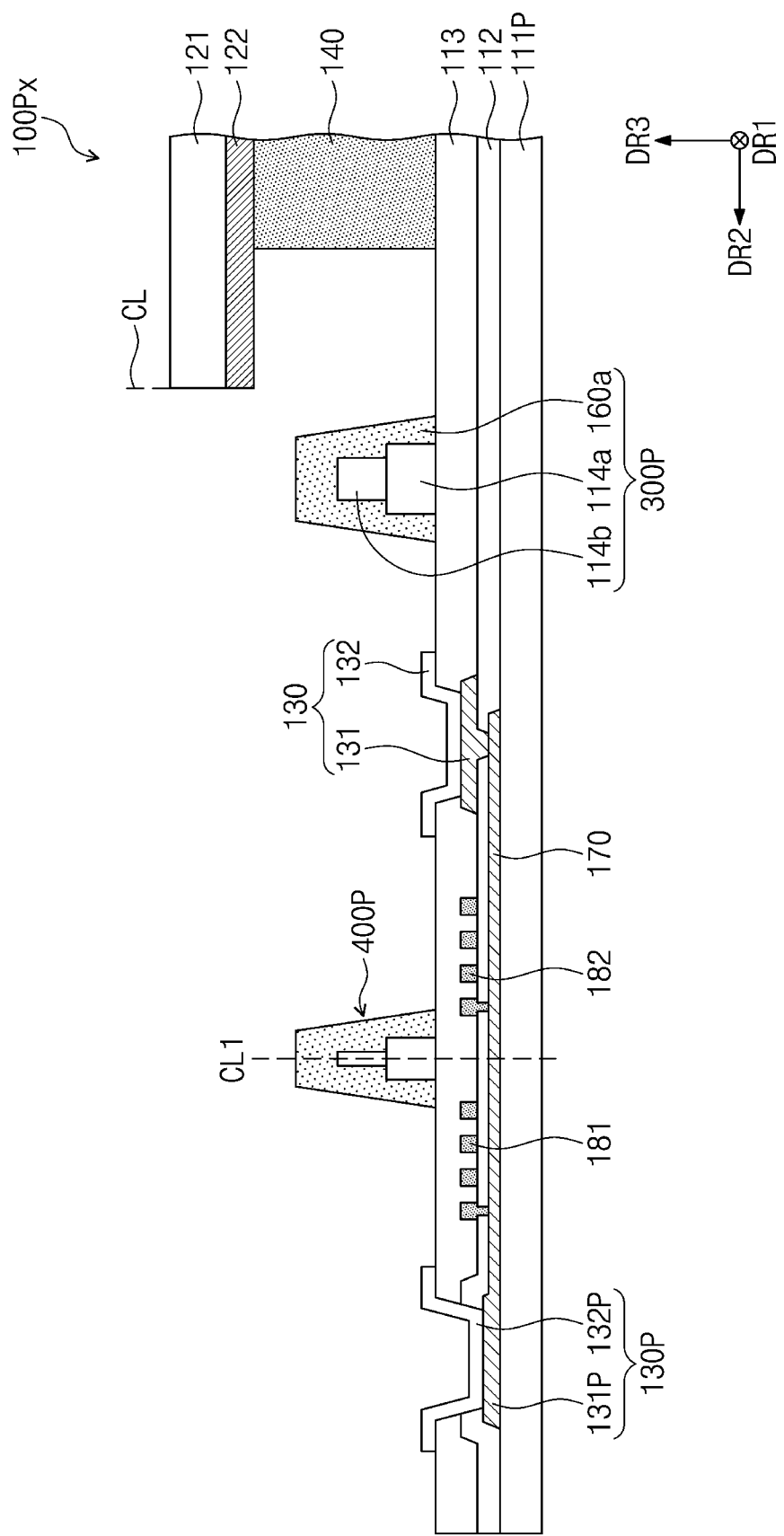
FIGS. 18, 19, 20A, and 20B are schematic cross-sectional views illustrating processes for manufacturing a display panel.

Referring to FIGS. 11 and 18, the display panel 100P may be first cut along the cutting line CL to form the display panel 100Px.

A portion of the second preliminary substrate 121P is removed, so that the test pads 130P may be exposed to the outside. A voltage may be applied to the test pads 130P to test the display panel 100Px.

Figure 19:
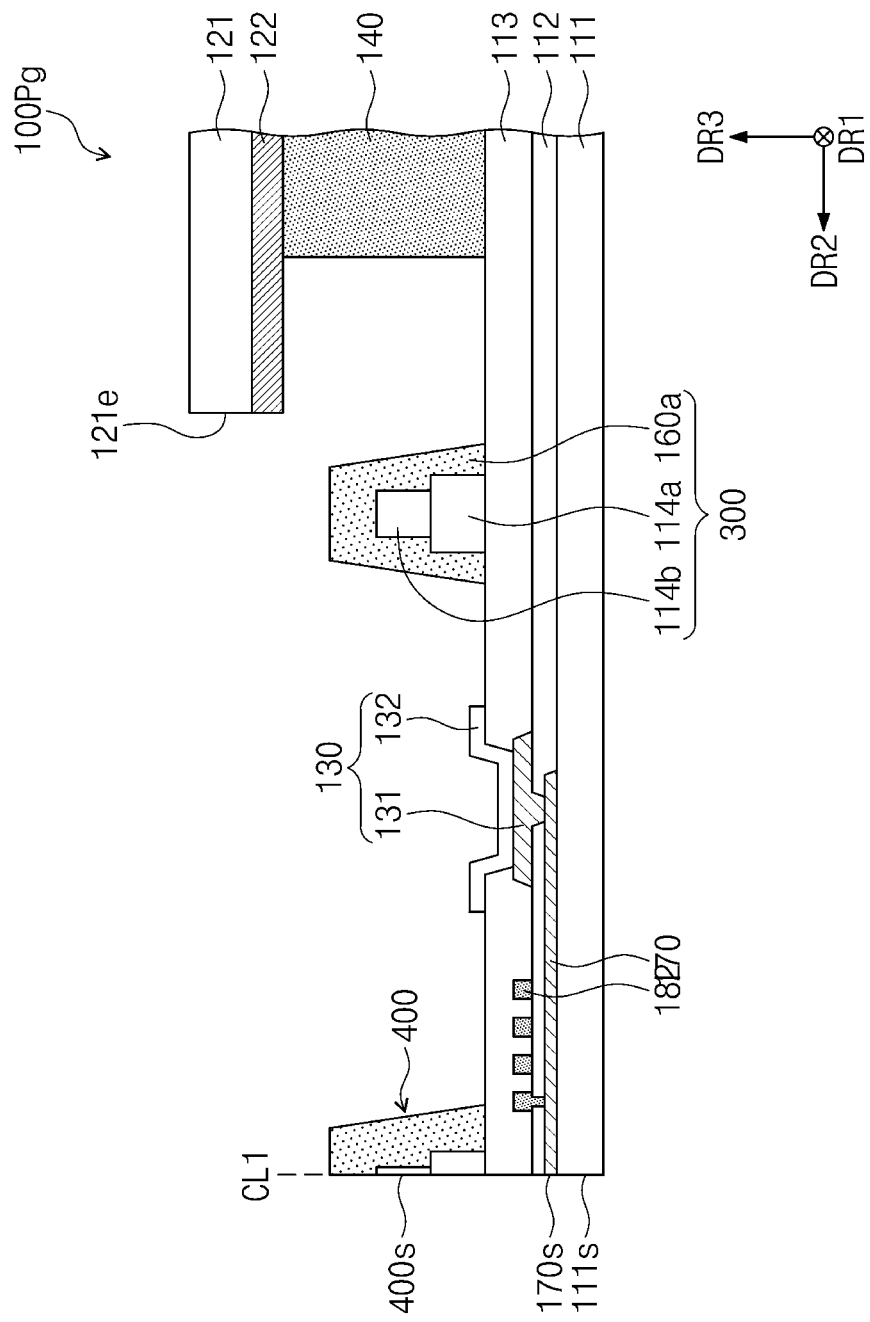

Referring to FIGS. 18 and 19, a cutting line CL1 may be defined in an area between the first connection wirings 181 and the second connection wirings 182, and the display panel 100Px may be cut along the cutting line CL1 to form the display panel 100Pg. The display panel 100Pg may not include test pads 130P and first connection wirings 181.

The first protruding part 300P may be referred to as a protruding pattern 300, and the second protruding part 400P may be partially removed to become an additional protruding pattern 400. The side surfaces 400s of the additional protruding pattern 400 and the side surfaces 111s of the first base substrate 111 may be formed by the same cutting process. Accordingly, side surfaces 400s of the additional protruding pattern 400 and side surfaces 111s of the first base substrate 111 may be aligned with the cutting line CL1.

Referring to the display panel 100Pg of FIG. 19, the second connection wirings 182 may remain in the display panel 100Pg. Referring to FIG. 10, the second connection wirings 182 may be respectively electrically connected to test wirings 170 (see FIG. 10). As the second connection wirings 182 may be electrically connected to the test wirings 170 (see FIG. 10), the display panel 100Pg may be protected from electrostatic discharge generated while the display panel 100Pg is being handled.

Figure 20A:
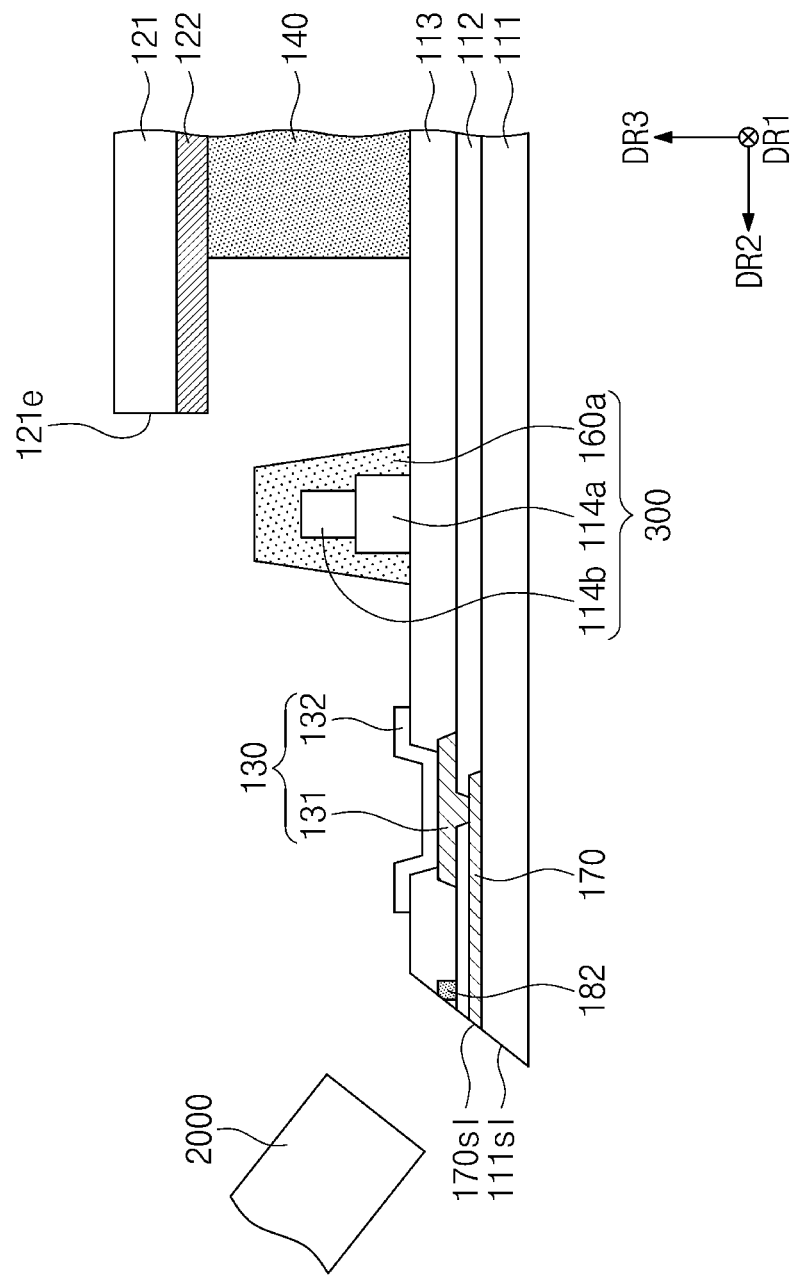

Referring to FIGS. 19 and 20A, the remaining second connection wirings 182 may be ground by using the grinder 2000. Accordingly, the pads 130 (see FIG. 1) of the display panel 100 (see FIG. 1) may be electrically separated from each other.

In the process of grinding the second connection wirings 182, an additional protruding pattern 400 may be removed.

The side surface 170s1 of the test wiring 170 and the side surface 111s1 of the first base substrate 111 may be simultaneously formed by the grinder 2000, and the side surface 170s1 of the test wiring 170 may form the same plane as the side surface 111s1 of the first base substrate 111.

Figure 20B:
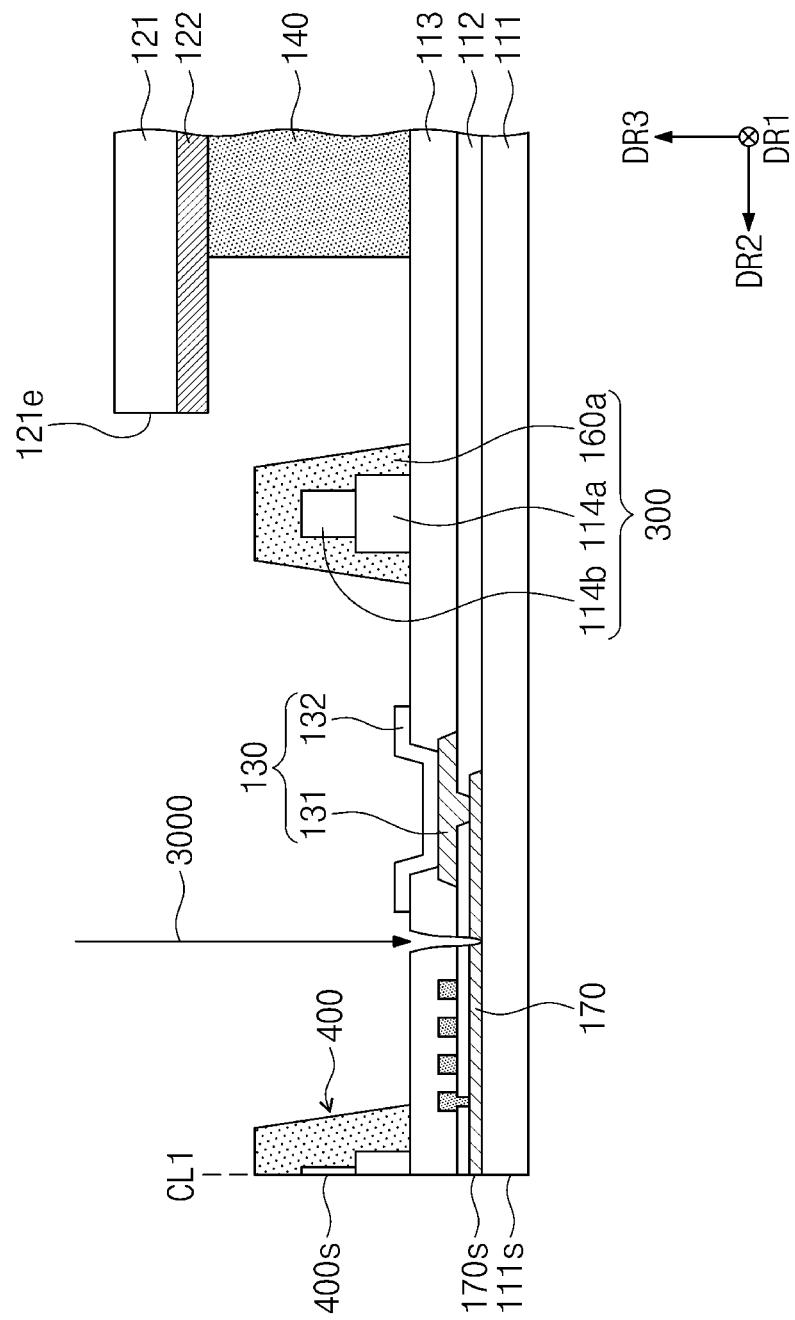

Referring to FIGS. 19 and 20B, electrical connection between the second connection wirings 182 and the test wirings 170 may be disconnected. For example, the laser 3000 may be irradiated to remove the electrical connection portion between the second connection wiring 182 and the test wirings 170.

As described above, the protruding pattern may prevent foreign substances generated during the cutting process of the display panel from entering the pads. Accordingly, pads may be prevented from being shorted by a conductive foreign material, and thus the manufacturing yield of the display panel and the display device may be improved.

The protruding pattern may be disposed in a space between the first base substrate and the second base substrate of the display panel, thereby preventing the second base substrate from sagging. Therefore, the deformation of the shape of the second base substrate may be reduced by the protruding pattern, and accordingly, luminance unevenness due to difference in cell gap in the active area of the display panel is reduced or eliminated so that a display panel and a display device with improved image quality may be provided.

Although embodiments have been described, it is understood that the disclosure should not be limited to these embodiments but various changes and modifications may be made by one of ordinary skill in the art within the spirit and scope of the disclosure as hereinafter claimed.

What is claimed is:

1. A display device comprising:
a first base substrate;
an insulating layer disposed on the first base substrate;
a coupling member disposed between the first base substrate and the second base substrate;
pads disposed on the first base substrate, arranged along a first direction, and comprising pad patterns disposed on the insulating layer; and
a first protruding pattern disposed between the coupling member and the pads, and disposed on the insulating layer, wherein
a thickness of the first protruding pattern is smaller than a thickness of the coupling member, each thickness being measured as a distance perpendicular from a main surface of the first base substrate,
when viewed in a thickness direction of the first base substrate, the first protruding pattern is spaced apart from the pad patterns,
the pad patterns and the first protruding pattern are in contact with the insulating layer, and
the first protruding pattern has a line shape extending along the first direction when viewed in the thickness direction of the first base substrate.

2. The display device of claim 1, wherein
the second base substrate has a smaller area than an area of the first base substrate, and
a side of the second base substrate overlaps the first base substrate in a thickness direction of the first base substrate.

3. The display device of claim 2, wherein
the first protruding pattern is disposed on the first base substrate, and the first protruding pattern and the side of the second base substrate extend in the first direction.

4. The display device of claim 2, wherein the first protruding pattern is spaced apart from the second base substrate in the thickness direction of the first base substrate.

5. The display device of claim 2, wherein the first protruding pattern overlaps the side of the second base substrate in the thickness direction of the first base substrate.

6. The display device of claim 2, wherein
the first protruding pattern comprises a first protruding portion and a second protruding portion spaced apart from the first protruding portion,
the first protruding portion does not overlap the second base substrate in the thickness direction of the first base substrate, and
the second protruding portion overlaps the second base substrate in the thickness direction of the first base substrate.

7. The display device of claim 1, further comprising:
a second protruding pattern spaced apart from the first protruding pattern,
wherein the pads are disposed between the first protruding pattern and the second protruding pattern, and
when viewed in the thickness direction of the first base substrate, the pads are spaced apart from the first protruding pattern and the second protruding pattern.

8. The display device of claim 7, wherein a stacking structure of the first protruding pattern and a stacking structure of the second protruding pattern are identical.

9. The display device of claim 7, wherein a side surface of the second protruding pattern is aligned with a side surface of the first base substrate.

10. The display device of claim 7, further comprising:
test wirings disposed on the first base substrate and extending from the pads toward an edge of the first base substrate, respectively,
wherein the second protruding pattern is disposed on the test wirings.

11. The display device of claim 1, wherein the first protruding pattern comprises a plurality of layers stacked in a thickness direction of the first base substrate.

12. The display device of claim 11, wherein the first protruding pattern comprises:
a first sub-layer of a first color; and
a second sub-layer of a second color different from the first color, the second sub-layer being disposed on the first sub-layer.

13. The display device of claim 12, wherein the first protruding pattern further comprises:
a third sub-layer overlapping the first sub-layer and the second sub-layer.

14. A display panel where an active area and a peripheral area are defined on a first base substrate and a second base substrate disposed on the first base substrate, the display panel comprising:
a pixel disposed in the active area;
data wirings extending from the pixel toward the peripheral area;
pads electrically connected to the data wirings, respectively, disposed in the peripheral area, and arranged along a first direction;

a first protruding pattern disposed between the pads and the active area; and
a second protruding pattern spaced apart from the first protruding pattern,
wherein
when viewed in a thickness direction of the first base substrate, the first protruding pattern overlaps an edge of the second base substrate, and
the pads are disposed between the first protruding pattern and the second protruding pattern.

15. The display panel of claim 14, wherein the first protruding pattern overlaps a portion of the data wiring.

16. The display panel of claim 14,
wherein
when viewed in the thickness direction of the first base substrate, the pads are spaced apart from the first protruding pattern and the second protruding pattern.

17. The display panel of claim 14, further comprising:
test wirings extending from the pads in a direction away from the active area, respectively, wherein a side surface of the test wiring is aligned with a side surface of the display panel.

18. The display panel of claim 17, wherein the first protruding pattern has a line shape extending along the first direction when viewed in the thickness direction of the first base substrate.

19. A display device comprising:
a display panel including a substrate that includes an active area and a peripheral area adjacent to the active area and an insulating layer disposed on the substrate,
wherein the display panel comprises:
pixels disposed in the active area;
pads disposed in the peripheral area, arranged along a first direction, comprising pad patterns disposed on the insulating layer, and electrically connected to the pixels;
a coupling member disposed in the peripheral area and disposed between the pixels and the pads;
a protruding pattern disposed between the pads and the coupling member and disposed on the insulating layer; and
wherein
when viewed in a thickness direction of the display panel, the protruding pattern is spaced apart from the pad patterns,
the pad patterns and the protruding pattern are in contact with the insulating layer,
a thickness of the protruding pattern is smaller than a thickness of the coupling member, each thickness being measured as a distance perpendicular from a main surface of the substrate, and
the protruding pattern has a line shape extending along the first direction when viewed in the thickness direction of the display panel.

20. The display device of claim 19, wherein the display panel further comprises test wirings extending from the pads toward an outer side surface of the display panel, respectively, and
side surfaces of the test wirings are aligned with the outer side surface of the display panel.

* * * * *